US012113615B2

(12) United States Patent
Xu et al.

(10) Patent No.: US 12,113,615 B2
(45) Date of Patent: *Oct. 8, 2024

(54) CRC BITS FOR JOINT DECODING AND VERIFICATION OF CONTROL INFORMATION USING POLAR CODES

(71) Applicant: QUALCOMM Incorporated, San Diego, CA (US)

(72) Inventors: Changlong Xu, Beijing (CN); Joseph Binamira Soriaga, San Diego, CA (US); Jilei Hou, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/332,412

(22) Filed: Jun. 9, 2023

(65) Prior Publication Data

US 2023/0336270 A1  Oct. 19, 2023

Related U.S. Application Data

(63) Continuation of application No. 16/831,263, filed on Mar. 26, 2020, now Pat. No. 11,711,163, which is a
(Continued)

(30) Foreign Application Priority Data

Dec. 15, 2016  (WO) ................ PCT/CN2016/110088

(51) Int. Cl.
*H04L 1/00*      (2006.01)
*H04L 43/0823*   (2022.01)
*H04L 69/324*    (2022.01)

(52) U.S. Cl.
CPC .......... *H04L 1/0061* (2013.01); *H04L 1/0057* (2013.01); *H04L 43/0847* (2013.01); *H04L 69/324* (2013.01)

(58) Field of Classification Search
None
See application file for complete search history.

(56) References Cited

U.S. PATENT DOCUMENTS 6,567,390 B1    5/2003  Banister et al.
8,634,779 B2    1/2014  Moulsley et al.
(Continued)

FOREIGN PATENT DOCUMENTS

CN    101471924 A    7/2009
CN    102122966 A    7/2011
(Continued)

OTHER PUBLICATIONS

Niu K., et al., "CRC-Aided Decoding of Polar Codes", IEEE Communications Letters, vol. 16, Issue 10, pp. 1668-1671, Oct. 2012 (Oct. 10, 2012).
(Continued)

*Primary Examiner* — Alex Skripnikov
(74) *Attorney, Agent, or Firm* — Loza & Loza, LLP

(57) ABSTRACT

Aspects of the disclosure relate to wireless communication systems configured to provide techniques for polar coding control information together with combined cyclic redundancy check (CRC) information. The combined CRC information may include a number of CRC bits selected to jointly decode and verify the control information to reduce the CRC overhead.

30 Claims, 16 Drawing Sheets

Related U.S. Application Data continuation of application No. 16/468,210, filed as application No. PCT/CN2017/088247 on Jun. 14, 2017, now Pat. No. 11,601,217.

(56) References Cited

U.S. PATENT DOCUMENTS

| | | | |
|---|---|---|---|
| 11,601,217 | B2 | 3/2023 | Xu et al. |
| 11,711,163 | B2 * | 7/2023 | Xu .................. H04L 69/324 370/216 |
| 2003/0192004 | A1 | 10/2003 | Gopalakrishnan |
| 2007/0297451 | A1 | 12/2007 | Kim et al. |
| 2014/0169388 | A1 | 6/2014 | Jeong et al. |
| 2014/0173376 | A1 | 6/2014 | Jeong et al. |
| 2015/0222295 | A1 | 8/2015 | Li et al. |
| 2015/0249473 | A1 | 9/2015 | Li et al. |
| 2016/0013810 | A1 | 1/2016 | Gross et al. |
| 2016/0241258 | A1 | 8/2016 | Zeng et al. |
| 2017/0019216 | A1 | 1/2017 | Li |
| 2018/0076929 | A1 | 3/2018 | Zhang et al. |
| 2019/0207710 | A1 | 7/2019 | Ye et al. |
| 2020/0076535 | A1 | 3/2020 | Xu et al. |
| 2020/0235854 | A1 | 7/2020 | Xu et al. |

FOREIGN PATENT DOCUMENTS

| | | |
|---|---|---|
| CN | 102694625 A | 9/2012 |
| CN | 103220001 A | 7/2013 |
| CN | 103636155 A | 3/2014 |
| CN | 103780329 A | 5/2014 |
| CN | 103825669 A | 5/2014 |
| CN | 104124979 A | 10/2014 |
| CN | 104918063 A | 9/2015 |
| CN | 105227189 A | 1/2016 |
| CN | 105337696 A | 2/2016 |
| CN | 105340183 A | 2/2016 |
| CN | 105811998 A | 7/2016 |
| CN | 106209113 A | 12/2016 |
| CN | 106230555 A | 12/2016 |
| CO | 94016034 A | 10/1995 |
| EP | 2802080 A1 | 11/2014 |
| JP | 2019524034 A | 8/2019 |
| KR | 20140077596 A | 6/2014 |
| RU | 2559292 C2 | 8/2015 |
| WO | 2018031777 A1 | 2/2018 |

OTHER PUBLICATIONS

Balatsoukas-Stimming A., et al., "LLR-Based Successive Cancellation List Decoding of Polar Codes", IEEE Transactions on Signal Processing, IEEE Service Center, New York, NY, US, vol. 63, No. 19, Oct. 1, 2015 (Oct. 1, 2015), XP011667871, URL: https://ieeexplore.ieee.org/document/7114328. pp. 5165-5179.
Chiu M.C., et al., "Reduced-Complexity SCL Decoding of Multi-CRC-Aided Polar Codes", Sep. 28, 2016, XP055384603, pp. 1-9, Retrieved from the Internet: URL:https://arxiv.org/pdf/1609.08813.pdf [retrieved on Jun. 23, 2017], p. 2, left-hand column, paragraph 2, section VI.

Dongdong Y., "The Improvement of the Decoding Performance of the Concatenation of BCH Codes and Systematic Polar Codes", P12202009, Information Technology Compilation of Chinese Master's Theses full-text Database, 68 Pages, Dec. 31, 2015.
Huawei, et al., "Polar Code Construction for NR", 3GPP TSG RAN WG1 Meeting #86bis, R1-1608862, 3rd Generation Partnership Project, Mobile Competence Centre, 650, Route Des Lucioles, F-06921 Sophia-Antipolis Cedex, France, vol. RAN WG1, No. Lisbon, Portugal, Oct. 10, 2016-Oct. 14, 2016, Oct. 14, 2016, 8 Pages, XP051159189, XP051148916, Oct. 1, 2016, p. 1 and 2.
International Preliminary Report on Patentability—PCT/CN2016/110088, The International Bureau of WIPO—Geneva, Switzerland, Jun. 27, 2019.
International Preliminary Report on Patentability—PCT/CN2017/088247, The International Bureau of WIPO—Geneva, Switzerland, Jun. 27, 2019.
International Search Report and Written Opinion—PCT/CN2016/110088—ISA/EPO—Apr. 21, 2017.
International Search Report and Written Opinion—PCT/CN2017/088247—ISA/EPO—Aug. 29, 2017.
Mediatek Inc: "Comparison of Coding Candidates for eMBB Data Channel of Short Codeblock Length" [online], 3GPP Draft, 3GPP TSG RAN WG1 Meeting #87, R1-1612134, Nov. 18, 2016, 12 Pages.
Qualcomm Incorporated: "Control Channel Performance", 3GPP Draft, 3GPP TSG-RAN WG1 #87, R1-1613085, Control Channel Performance, 3rd Generation Partnership Project, Mobile Competence Centre, 650, Route Des Lucioles, F-06921 Sophia-Antipolis Cedex, France, vol. RAN WG1, No. Reno, USA, Nov. 14, 2016-Nov. 18, 2016, Nov. 19, 2016, XP051190976, 11 Pages, p. 1, pp. 3, 4, p. 5, line 1-line 3.
Qualcomm Incorporated: "Design of Polar Codes for Control Channel", 3GPP Draft, 3GPP TSG-RAN WG1 NR AdHoc, R1-1700832 Design of Polar Codes for Control Channel, 3rd Generation Partnership Project, Mobile Competence Centre, 650, Route Des Lucioles, F-06921 Sophia-Antipolis Cedex, France, vol. RAN WG1, No. Spokane, USA, Jan. 16, 2017-Jan. 20, 2017 Jan. 16, 2017, XP051208351, pp. 1-5, section 2.1.
Qualcomm Incorporated: "Design of Polar Codes for Control Channel", 3GPP TSG-RAN WG1 NR AdHoc, pp. 1-5. 2016, Retrieved on: https://www.3gpp.org/ftp/tsg_ran/WG1_RL1/TSGR1_AH/NR_AH_1701/Docs/.
Samsung: "Performance Comparison of Short Length LDPC and Polar Codes" [online], 3GPP Draft, 3GPP TSG RAN WG1 #87, R1-1613043, Nov. 11, 2016, 7 Pages.
Supplementary European Search Report—EP17880126—Search Authority—Munich—Jul. 2, 2020.
Zhou, H., et al., "Segmented CRC-Aided SC List Polar Decoding", 2016 IEEE 83rd Vehicular Technology Conference (VTC Spring), May 15, 2016 (May 15, 2016), XP032918751, 5 Pages, Jul. 7, 2016, Retrieved from the Internet: URL: https://ieeexplore.ieee.org/document/7504469, DOI: 10.1109/VTCSPRING.2016.7504469, [retrieved on Jul. 5, 2016], Sections III, Abstract, Figs. 2, 4, 7.
AT&T: "Polar Code Design for DCI", 3GPP TSG RAN WG1 Meeting #88, R1-1702277, Feb. 13-17, 2017 Athens, Greece, 3 Pages.
Interdigital: "Updated Recommendation for UE-specific CRC", Internet Citation, Nov. 5, 2001, XP002345604, 3 Pages.

* cited by examiner

CRC BITS FOR JOINT DECODING AND VERIFICATION OF CONTROL INFORMATION USING POLAR CODES

PRIORITY CLAIM

The present Application for Patent is a Continuation of Non-Provisional application Ser. No. 16/831,263 filed in the U.S. Patent and Trademark Office on Mar. 26, 2020, the entire content of which is incorporated herein by reference as if fully set forth below in its entirety and for all applicable purposes. application Ser. No. 16/831,263 is a Continuation of Non-Provisional application Ser. No. 16/468,210 filed in the U.S. Patent and Trademark Office on Jun. 10, 2019, the entire content of which is incorporated herein by reference as if fully set forth below in its entirety and for all applicable purposes. application Ser. No. 16/468,210 is the U.S. national stage of PCT patent application number PCT/CN2017/088247 filed on Jun. 14, 2017, which claims priority to and the benefit of PCT Application No. PCT/CN2016/110088 filed on Dec. 15, 2016, the entire content of each of which is incorporated herein by reference as if fully set forth below in its entirety and for all applicable purposes.

TECHNICAL FIELD

The technology discussed below relates generally to wireless communication systems, and more particularly, to a control channel design using polar codes. Embodiments can provide techniques for polar coding control information including combined cyclic redundancy check (CRC) information, where the combined CRC information includes a number of CRC bits selected to jointly decode and verify the control information in order to reduce the CRC overhead.

INTRODUCTION

Block codes, or error correcting codes, are frequently used to provide reliable transmission of digital messages over noisy channels. In a typical block code, an information message or sequence is split up into blocks, and an encoder at the transmitting device then mathematically adds redundancy to the information message. Exploitation of this redundancy in the encoded information message is the key to the reliability of the message, enabling correction for any bit errors that may occur due to the noise. That is, a decoder at the receiving device can take advantage of the redundancy to reliably recover the information message even though bit errors may occur, in part, due to the addition of noise to the channel.

Many examples of such error correcting block codes are known to those of ordinary skill in the art, including Hamming codes, Bose-Chaudhuri-Hocquenghem (BCH) codes, turbo codes, and low-density parity check (LDPC) codes, among others. Many existing wireless communication networks utilize such block codes, such as 3GPP LTE networks, which utilize turbo codes; and IEEE 802.11n Wi-Fi networks, which utilize LDPC codes. However, for future networks, a new category of block codes, called polar codes, presents a potential opportunity for reliable and efficient information transfer with improved performance relative to turbo codes and LDPC codes.

While research into implementation of polar codes continues to rapidly advance its capabilities and potential, additional enhancements are desired, particularly for potential deployment of future wireless communication networks beyond LTE.

BRIEF SUMMARY OF SOME EXAMPLES

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Various aspects of the disclosure provide for polar coding control information together with combined cyclic redundancy check (CRC) information in a wireless transmission. The combined CRC information may include a number of CRC bits selected to jointly decode and verify the control information in order to reduce the CRC overhead.

In one aspect of the disclosure, a method of wireless communication is provided. The method includes generating an information block including control information for a scheduled entity and generating cyclic redundancy check (CRC) information for the information block. The CRC information includes at least a total number of combined CRC bits to accommodate a list size utilized in successive-cancellation list (SCL) decoding at the scheduled entity. The method further includes encoding the information block, including the CRC information, utilizing polar coding to generate a polar code block, and transmitting the polar code block to the scheduled entity over a wireless air interface.

Another aspect of the disclosure provides an apparatus configured for polar coding. The apparatus includes a transceiver, a memory, and a processor communicatively coupled to the transceiver and the memory. The processor is configured to generate an information block including control information for a scheduled entity and generate cyclic redundancy check (CRC) information for the information block. The CRC information includes at least a total number of combined CRC bits to accommodate a list size utilized in successive-cancellation list (SCL) decoding at the scheduled entity. The processor is further configured to encode the information block, including the CRC information, utilizing polar coding to generate a polar code block, and transmit the polar code block to the scheduled entity over a wireless air interface via the transceiver.

Examples of additional aspects of the disclosure follow. In some aspects of the present disclosure, the total number of the combined CRC bits is selected to be equal to a sum of a first number of integrity check bits and a second number of CRC-aided SCL bits, where the second number of the CRC-aided SCL bits is selected based on the list size. In some aspects of the disclosure, the second number of the CRC-aided SCL bits is selected to be equal to a binary logarithm of the list size.

In some examples, the second number of the CRC-aided SCL bits includes three bits when the list size is equal to eight. In some examples, the second number of the CRC-aided SCL bits includes five bits when the list size is equal to thirty-two. In some examples, the first number of the integrity check bits includes sixteen bits.

In some aspects of the disclosure, the information block includes a plurality of original bit locations and the polar code block includes a plurality of coded bit locations, where each of the plurality of coded bit locations corresponds to one of a plurality of sub-channels. In some aspects of the present disclosure, a reliability metric for each of the original bit locations may be determined to produce a plurality of reliability metrics. The plurality of sub-channels may then be sorted based on the plurality of reliability metrics in order from highest reliability metrics to lowest reliability metrics, and a portion of the plurality of sub-channels having the highest reliability metrics may be allocated to the CRC information. In some aspects of the present disclosure, a portion of the plurality of sub-channels distributed among the plurality of sub-channels may be allocated to the CRC information.

In some aspects of the disclosure, an additional number of zero bits may be added to the control information to produce a first polynomial, where the additional number of the zero bits is equal to the total number of the combined CRC bits. The first polynomial may then be divided by a generator polynomial to produce a remainder polynomial including the total number of the combined CRC bits, the combined CRC bits may be scrambled with an identifier associated with the scheduled entity to produce the CRC information, and the CRC information may be appended to the control information in the information block.

In another aspect of the disclosure, a method of wireless communication operable at a scheduled entity is provided. The method includes receiving a polar code block including control information for the scheduled entity and cyclic redundancy check (CRC) information including at least a total number of combined CRC bits to accommodate a list size utilized in successive-cancellation list (SCL) decoding at the scheduled entity. The method further includes decoding the polar code block utilizing SCL decoding and the CRC information to produce an information block including the control information and the CRC information, and verifying an integrity of the control information utilizing the CRC information.

Another aspect of the disclosure provides an apparatus configured for polar decoding. The apparatus includes a processor, a memory communicatively coupled to the processor, and a transceiver communicatively coupled to the processor. The processor is configured to receive a polar code block including control information for the scheduled entity and cyclic redundancy check (CRC) information including at least a total number of combined CRC bits to accommodate a list size utilized in successive-cancellation list (SCL) decoding at the apparatus. The processor is further configured to decode the polar code block utilizing SCL decoding and the CRC information to produce an information block comprising the control information and the CRC information, and verify an integrity of the control information utilizing the CRC information.

Examples of additional aspects of the disclosure follow. In some aspects of the present disclosure, the total number of the combined CRC bits is selected to be equal to a sum of a first number of integrity check bits and a second number of CRC-aided SCL bits, where the second number of the CRC-aided SCL bits is selected based on the list size. In some aspects of the disclosure, the second number of the CRC-aided SCL bits is selected to be equal to a binary logarithm of the list size.

In some examples, the second number of the CRC-aided SCL bits includes three bits when the list size is equal to eight. In some examples, the second number of the CRC-aided SCL bits includes five bits when the list size is equal to thirty-two. In some examples, the first number of the integrity check bits includes sixteen bits.

In some aspects of the disclosure, the information block includes a plurality of original bit locations and the polar code block includes a plurality of coded bit locations, where each of the plurality of coded bit locations corresponds to one of a plurality of sub-channels. In some aspects of the present disclosure, the CRC information is received within a portion of the plurality of sub-channels having highest reliability metrics.

In some aspects of the disclosure, the CRC information may be descrambled utilizing an identifier associated with the scheduled entity to produce the combined CRC bits, the information block including the control information and the combined CRC bits may then be divided by a generator polynomial to produce a remainder, and if the remainder is equal to zero, the control information may be verified as correctly received.

In some aspects of the disclosure, the polar code block may be decoded to produce a plurality of information block candidates, where a number of the plurality of information block candidates is equal to the list size. The CRC information may then be utilized to select one of the plurality of information block candidates as the information block.

These and other aspects of the invention will become more fully understood upon a review of the detailed description, which follows. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

Radio Access Network

Figure 1:
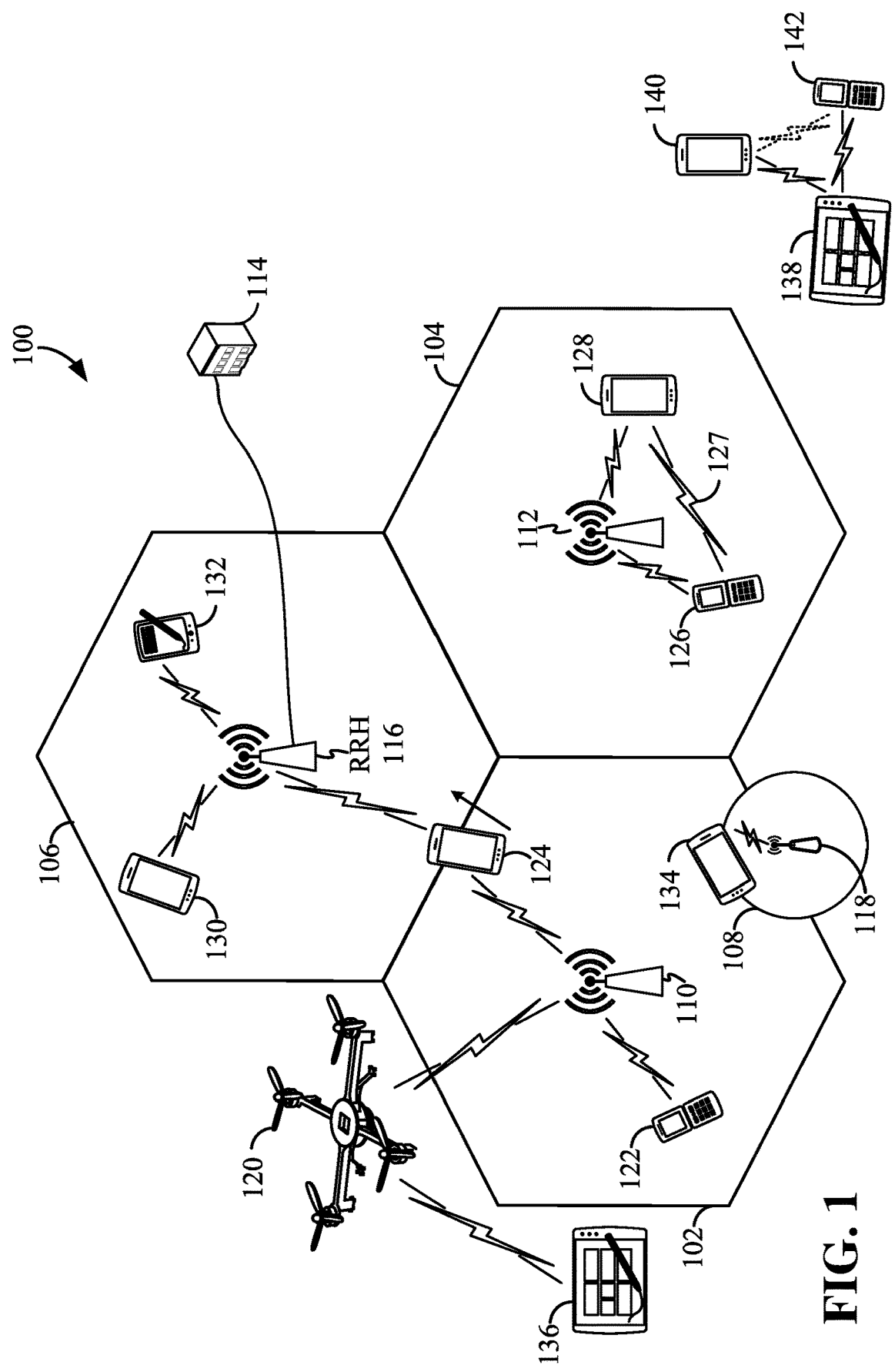
FIG. 1 is a conceptual diagram illustrating an example of a radio access network.

The various concepts presented throughout this disclosure may be implemented across a broad variety of telecommunication systems, network architectures, and communication standards. Referring now to FIG. 1, as an illustrative example without limitation, a schematic illustration of a radio access network 100 is provided. The radio access network 100 may be a next generation (e.g., fifth generation (5G)) access network or a legacy (e.g., 3G or 4G) access network. In addition, one or more nodes in the radio access network 100 may be next generation nodes or legacy nodes.

As used herein, the term legacy access network refers to a network employing a third generation (3G) wireless communication technology based on a set of standards that complies with the International Mobile Telecommunications-2000 (IMT-2000) specifications or a fourth generation (4G) wireless communication technology based on a set of standards that comply with the International Mobile Telecommunications Advanced (ITU-Advanced) specification. For example, some the standards promulgated by the 3rd Generation Partnership Project (3GPP) and the 3rd Generation Partnership Project 2 (3GPP2) may comply with IMT-2000 and/or ITU-Advanced. Examples of such legacy standards defined by the 3rd Generation Partnership Project (3GPP) include, but are not limited to, Long-Term Evolution (LTE), LTE-Advanced, Evolved Packet System (EPS), and Universal Mobile Telecommunication System (UMTS). Additional examples of various radio access technologies based on one or more of the above-listed 3GPP standards include, but are not limited to, Universal Terrestrial Radio Access (UTRA), Evolved Universal Terrestrial Radio Access (eUTRA), General Packet Radio Service (GPRS) and Enhanced Data Rates for GSM Evolution (EDGE). Examples of such legacy standards defined by the 3rd Generation Partnership Project 2 (3GPP2) include, but are not limited to, CDMA2000 and Ultra Mobile Broadband (UMB). Other examples of standards employing 3G/4G wireless communication technology include the IEEE 802.16 (WiMAX) standard and other suitable standards.

As further used herein, the term next generation access network generally refers to a network employing continued evolved wireless communication technologies. This may include, for example, a fifth generation (5G) wireless communication technology based on a set of standards. The standards may comply with the guidelines set forth in the 5G White Paper published by the Next Generation Mobile Networks (NGMN) Alliance on Feb. 17, 2015. For example, standards that may be defined by the 3GPP following LTE-Advanced or by the 3GPP2 following CDMA2000 may comply with the NGMN Alliance 5G White Paper. Standards may also include pre-3GPP efforts specified by Verizon Technical Forum (www.vstgf) and Korea Telecom SIG (www.kt5g.org).

The geographic region covered by the radio access network 100 may be divided into a number of cellular regions (cells) that can be uniquely identified by a user equipment (UE) based on an identification broadcasted over a geographical from one access point or base station. FIG. 1 illustrates macrocells 102, 104, and 106, and a small cell 108, each of which may include one or more sectors. A sector is a sub-area of a cell. All sectors within one cell are served by the same base station. A radio link within a sector can be identified by a single logical identification belonging to that sector. In a cell that is divided into sectors, the multiple sectors within a cell can be formed by groups of antennas with each antenna responsible for communication with UEs in a portion of the cell.

In general, a base station (BS) serves each cell. Broadly, a base station is a network element in a radio access network responsible for radio transmission and reception in one or more cells to or from a UE. A BS may also be referred to by those skilled in the art as a base transceiver station (BTS), a radio base station, a radio transceiver, a transceiver function, a basic service set (BSS), an extended service set (ESS), an access point (AP), a Node B (NB), an eNode B (eNB), a GNodeB or some other suitable terminology.

In FIG. 1, two high-power base stations 110 and 112 are shown in cells 102 and 104; and a third high-power base station 114 is shown controlling a remote radio head (RRH) 116 in cell 106. That is, a base station can have an integrated antenna or can be connected to an antenna or RRH by feeder cables. In the illustrated example, the cells 102, 104, and 106 may be referred to as macrocells, as the high-power base stations 110, 112, and 114 support cells having a large size. Further, a low-power base station 118 is shown in the small cell 108 (e.g., a microcell, picocell, femtocell, home base station, home Node B, home eNode B, etc.) which may overlap with one or more macrocells. In this example, the cell 108 may be referred to as a small cell, as the low-power base station 118 supports a cell having a relatively small size. Cell sizing can be done according to system design as well as component constraints. It is to be understood that the radio access network 100 may include any number of wireless base stations and cells. Further, a relay node may be deployed to extend the size or coverage area of a given cell. The base stations 110, 112, 114, 118 provide wireless access points to a core network for any number of mobile apparatuses.

FIG. 1 further includes a quadcopter or drone 120, which may be configured to function as a base station. That is, in some examples, a cell may not necessarily be stationary, and the geographic area of the cell may move according to the location of a mobile base station such as the quadcopter 120.

In general, base stations may include a backhaul interface for communication with a backhaul portion of the network. The backhaul may provide a link between a base station and a core network, and in some examples, the backhaul may provide interconnection between the respective base stations. The core network is a part of a wireless communication system that is generally independent of the radio access technology used in the radio access network. Various types of backhaul interfaces may be employed, such as a direct physical connection, a virtual network, or the like using any suitable transport network. Some base stations may be configured as integrated access and backhaul (IAB) nodes, where the wireless spectrum may be used both for access links (i.e., wireless links with UEs), and for backhaul links. This scheme is sometimes referred to as wireless self-backhauling. By using wireless self-backhauling, rather than requiring each new base station deployment to be outfitted with its own hard-wired backhaul connection, the wireless spectrum utilized for communication between the base station and UE may be leveraged for backhaul communication, enabling fast and easy deployment of highly dense small cell networks.

The radio access network 100 is illustrated supporting wireless communication for multiple mobile apparatuses. A mobile apparatus is commonly referred to as user equipment (UE) in standards and specifications promulgated by the 3rd Generation Partnership Project (3GPP), but may also be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, or some other suitable terminology. A UE may be an apparatus that provides a user with access to network services.

Within the present document, a "mobile" apparatus need not necessarily have a capability to move, and may be stationary. The term mobile apparatus or mobile device broadly refers to a diverse array of devices and technologies. For example, some non-limiting examples of a mobile apparatus include a mobile, a cellular (cell) phone, a smart phone, a session initiation protocol (SIP) phone, a laptop, a personal computer (PC), a notebook, a netbook, a smartbook, a tablet, a personal digital assistant (PDA), and a broad array of embedded systems, e.g., corresponding to an "Internet of things" (IoT). A mobile apparatus may additionally be an automotive or other transportation vehicle, a remote sensor or actuator, a robot or robotics device, a satellite radio, a global positioning system (GPS) device, an object tracking device, a drone, a multi-copter, a quad-copter, a remote control device, a consumer and/or wearable device, such as eyewear, a wearable camera, a virtual reality device, a smart watch, a health or fitness tracker, a digital audio player (e.g., MP3 player), a camera, a game console, etc. A mobile apparatus may additionally be a digital home or smart home device such as a home audio, video, and/or multimedia device, an appliance, a vending machine, intelligent lighting, a home security system, a smart meter, etc. A mobile apparatus may additionally be a smart energy device, a security device, a solar panel or solar array, a municipal infrastructure device controlling electric power (e.g., a smart grid), lighting, water, etc.; an industrial automation and enterprise device; a logistics controller; agricultural equipment; military defense equipment, vehicles, aircraft, ships, and weaponry, etc. Still further, a mobile apparatus may provide for connected medicine or telemedicine support, i.e., health care at a distance. Telehealth devices may include telehealth monitoring devices and telehealth administration devices, whose communication may be given preferential treatment or prioritized access over other types of information, e.g., in terms of prioritized access for transport of critical service user data traffic, and/or relevant QoS for transport of critical service user data traffic.

Within the radio access network 100, the cells may include UEs that may be in communication with one or more sectors of each cell. For example, UEs 122 and 124 may be in communication with base station 110; UEs 126 and 128 may be in communication with base station 112; UEs 130 and 132 may be in communication with base station 114 by way of RRH 116; UE 134 may be in communication with low-power base station 118; and UE 136 may be in communication with mobile base station 120. Here, each base station 110, 112, 114, 118, and 120 may be configured to provide an access point to a core network (not shown) for all the UEs in the respective cells.

In another example, a mobile network node (e.g., quadcopter 120) may be configured to function as a UE. For example, the quadcopter 120 may operate within cell 102 by communicating with base station 110. In some aspects of the disclosure, two or more UE (e.g., UEs 126 and 128) may communicate with each other using peer to peer (P2P) or sidelink signals 127 without relaying that communication through a base station (e.g., base station 112).

Unicast or broadcast transmissions of control information and/or user data traffic from a base station (e.g., base station 110) to one or more UEs (e.g., UEs 122 and 124) may be referred to as downlink (DL) transmission, while transmissions of control information and/or user data traffic originating at a UE (e.g., UE 122) may be referred to as uplink (UL) transmissions. In addition, the uplink and/or downlink control information and/or traffic information may be time-divided into frames, subframes, slots, mini-slots and/or symbols. As used herein, a symbol may refer to a unit of time that, in an orthogonal frequency division multiplexed (OFDM) waveform, carries one resource element (RE) per sub-carrier. A slot may carry 7 or 14 OFDM symbols. A mini-slot may carry less than 7 OFDM symbols or less than 14 OFDM symbols. A subframe may refer to a duration of 1 ms. Multiple subframes or slots may be grouped together to form a single frame or radio frame. Of course, these definitions are not required, and any suitable scheme for organizing waveforms may be utilized, and various time divisions of the waveform may have any suitable duration.

The air interface in the radio access network 100 may utilize one or more multiplexing and multiple access algorithms to enable simultaneous communication of the various devices. For example, multiple access for uplink (UL) or reverse link transmissions from UEs 122 and 124 to base station 110 may be provided utilizing time division multiple access (TDMA), code division multiple access (CDMA), frequency division multiple access (FDMA), orthogonal frequency division multiple access (OFDMA), sparse code multiple access (SCMA), single-carrier frequency division multiple access (SC-FDMA), resource spread multiple access (RSMA), or other suitable multiple access schemes. Further, multiplexing downlink (DL) or forward link transmissions from the base station 110 to UEs 122 and 124 may be provided utilizing time division multiplexing (TDM), code division multiplexing (CDM), frequency division multiplexing (FDM), orthogonal frequency division multiplexing (OFDM), sparse code multiplexing (SCM), single-carrier frequency division multiplexing (SC-FDM) or other suitable multiplexing schemes.

Further, the air interface in the radio access network 100 may utilize one or more duplexing algorithms. Duplex refers to a point-to-point communication link where both endpoints can communicate with one another in both directions. Full duplex means both endpoints can simultaneously communicate with one another. Half duplex means only one endpoint can send information to the other at a time. In a wireless link, a full duplex channel generally relies on physical isolation of a transmitter and receiver, and suitable interference cancellation technologies. Full duplex emulation is frequently implemented for wireless links by utilizing frequency division duplex (FDD) or time division duplex (TDD). In FDD, transmissions in different directions operate at different carrier frequencies. In TDD, transmissions in different directions on a given channel are separated from one another using time division multiplexing. That is, at some times the channel is dedicated for transmissions in one direction, while at other times the channel is dedicated for transmissions in the other direction, where the direction may change very rapidly, e.g., several times per subframe.

In the radio access network 100, the ability for a UE to communicate while moving, independent of their location, is referred to as mobility. The various physical channels between the UE and the radio access network are generally set up, maintained, and released under the control of a mobility management entity (MME). In various aspects of the disclosure, a radio access network 100 may utilize DL-based mobility or UL-based mobility to enable mobility and handovers (i.e., the transfer of a UE's connection from one radio channel to another). In a network configured for DL-based mobility, during a call with a scheduling entity, or at any other time, a UE may monitor various parameters of the signal from its serving cell as well as various parameters of neighboring cells. Depending on the quality of these parameters, the UE may maintain communication with one or more of the neighboring cells. During this time, if the UE moves from one cell to another, or if signal quality from a neighboring cell exceeds that from the serving cell for a given amount of time, the UE may undertake a handoff or handover from the serving cell to the neighboring (target) cell. For example, UE 124 may move from the geographic area corresponding to its serving cell 102 to the geographic area corresponding to a neighbor cell 106. When the signal strength or quality from the neighbor cell 106 exceeds that of its serving cell 102 for a given amount of time, the UE 124 may transmit a reporting message to its serving base station 110 indicating this condition. In response, the UE 124 may receive a handover command, and the UE may undergo a handover to the cell 106.

In a network configured for UL-based mobility, UL reference signals from each UE may be utilized by the network to select a serving cell for each UE. In some examples, the base stations 110, 112, and 114/116 may broadcast unified synchronization signals (e.g., unified Primary Synchronization Signals (PSSs), unified Secondary Synchronization Signals (SSSs) and unified Physical Broadcast Channels (PBCH)). The UEs 122, 124, 126, 128, 130, and 132 may receive the unified synchronization signals, derive the carrier frequency and subframe timing from the synchronization signals, and in response to deriving timing, transmit an uplink pilot or reference signal. The uplink pilot signal transmitted by a UE (e.g., UE 124) may be concurrently received by two or more cells (e.g., base stations 110 and 114/116) within the radio access network 100. Each of the cells may measure a strength of the pilot signal, and the access network (e.g., one or more of the base stations 110 and 114/116 and/or a central node within the core network) may determine a serving cell for the UE 124. As the UE 124 moves through the radio access network 100, the network may continue to monitor the uplink pilot signal transmitted by the UE 124. When the signal strength or quality of the pilot signal measured by a neighboring cell exceeds that of the signal strength or quality measured by the serving cell, the network 100 may handover the UE 124 from the serving cell to the neighboring cell, with or without informing the UE 124.

Although the synchronization signal transmitted by the base stations 110, 112, and 114/116 may be unified, the synchronization signal may not identify a particular cell, but rather may identify a zone of multiple cells operating on the same frequency and/or with the same timing. The use of zones in 5G networks or other next generation communication networks enables the uplink-based mobility framework and improves the efficiency of both the UE and the network, since the number of mobility messages that need to be exchanged between the UE and the network may be reduced.

In various implementations, the air interface in the radio access network 100 may utilize licensed spectrum, unlicensed spectrum, or shared spectrum. Licensed spectrum provides for exclusive use of a portion of the spectrum, generally by virtue of a mobile network operator purchasing a license from a government regulatory body. Unlicensed spectrum provides for shared use of a portion of the spectrum without need for a government-granted license. While compliance with some technical rules is generally still required to access unlicensed spectrum, generally, any operator or device may gain access. Shared spectrum may fall between licensed and unlicensed spectrum, wherein technical rules or limitations may be required to access the spectrum, but the spectrum may still be shared by multiple operators and/or multiple RATs. For example, the holder of a license for a portion of licensed spectrum may provide licensed shared access (LSA) to share that spectrum with other parties, e.g., with suitable licensee-determined conditions to gain access.

Signaling Entities

In some examples, access to the air interface may be scheduled, wherein a scheduling entity (e.g., a base station) allocates resources (e.g., time-frequency resources) for communication among some or all devices and equipment within its service area or cell. Within the present disclosure, as discussed further below, the scheduling entity may be responsible for scheduling, assigning, reconfiguring, and releasing resources for one or more scheduled entities. That is, for scheduled communication, UEs or scheduled entities utilize resources allocated by the scheduling entity.

Base stations are not the only entities that may function as a scheduling entity. That is, in some examples, a UE may function as a scheduling entity, scheduling resources for one or more scheduled entities (e.g., one or more other UEs). In other examples, sidelink signals may be used between UEs without necessarily relying on scheduling or control information from a base station. For example, UE 138 is illustrated communicating with UEs 140 and 142. In some examples, the UE 138 is functioning as a scheduling entity or a primary sidelink device, and UEs 140 and 142 may function as a scheduled entity or a non-primary (e.g., secondary) sidelink device. In still another example, a UE may function as a scheduling entity in a device-to-device (D2D), peer-to-peer (P2P), or vehicle-to-vehicle (V2V) network, and/or in a mesh network. In a mesh network example, UEs 140 and 142 may optionally communicate directly with one another in addition to communicating with the scheduling entity 138.

Figure 2:
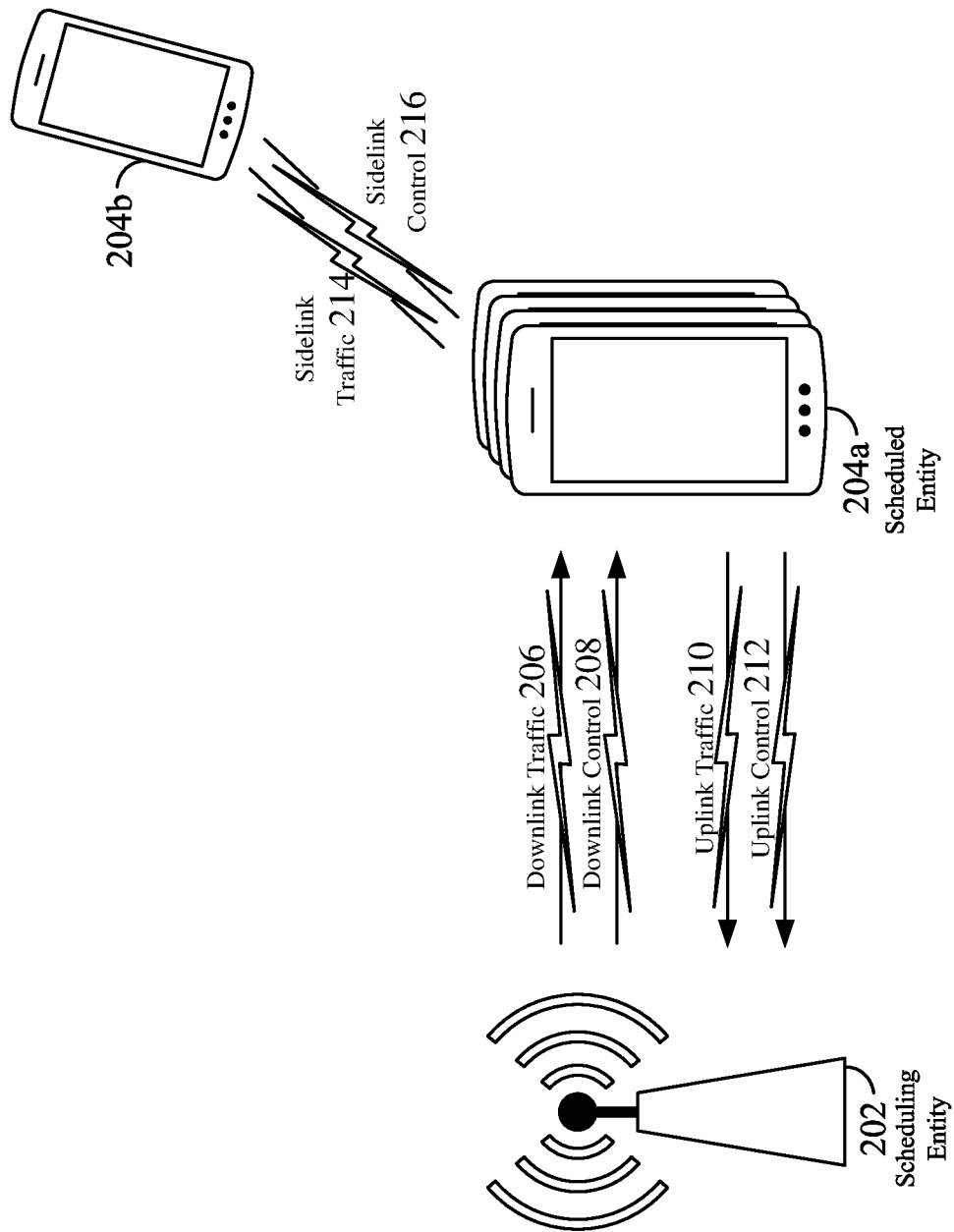
FIG. 2 is a block diagram conceptually illustrating an example of a scheduling entity communicating with one or more scheduled entities according to some embodiments.

Thus, in a wireless communication network with scheduled access to time-frequency resources and having a cellular configuration, a P2P configuration, or a mesh configuration, a scheduling entity and one or more scheduled entities may communicate utilizing the scheduled resources. Referring now to FIG. 2, a block diagram illustrates a scheduling entity 202 and a plurality of scheduled entities 204 (e.g., 204a and 204b). Here, the scheduling entity 202 may correspond to a base station 110, 112, 114, and/or 118. In additional examples, the scheduling entity 202 may correspond to a UE 138, the quadcopter 120, or any other suitable node in the radio access network 100. Similarly, in various examples, the scheduled entity 204 may correspond to the UE 122, 124, 126, 128, 130, 132, 134, 136, 138, 140, and 142, or any other suitable node in the radio access network 100.

As illustrated in FIG. 2, the scheduling entity 202 may broadcast user data traffic 206 to one or more scheduled entities 204 (the user data traffic may be referred to as downlink user data traffic). In accordance with certain aspects of the present disclosure, the term downlink may refer to a point-to-multipoint transmission originating at the scheduling entity 202. Broadly, the scheduling entity 202 is a node or device responsible for scheduling user data traffic in a wireless communication network, including the downlink transmissions and, in some examples, uplink user data traffic 210 from one or more scheduled entities to the scheduling entity 202. Another way to describe the system may be to use the term broadcast channel multiplexing. In accordance with aspects of the present disclosure, the term uplink may refer to a point-to-point transmission originating at a scheduled entity 204. Broadly, the scheduled entity 204 is a node or device that receives scheduling control information, including but not limited to scheduling grants, synchronization or timing information, or other control information from another entity in the wireless communication network such as the scheduling entity 202.

The scheduling entity 202 may broadcast control information 208 including one or more control channels, such as a PBCH; a PSS; a SSS; a physical control format indicator channel (PCFICH); a physical hybrid automatic repeat request (HARQ) indicator channel (PHICH); and/or a physical downlink control channel (PDCCH), etc., to one or more scheduled entities 204. The PHICH carries HARQ feedback transmissions such as an acknowledgment (ACK) or negative acknowledgment (NACK). HARQ is a technique well known to those of ordinary skill in the art, wherein packet transmissions may be checked at the receiving side for accuracy, and if confirmed, an ACK may be transmitted, whereas if not confirmed, a NACK may be transmitted. In response to a NACK, the transmitting device may send a HARQ retransmission, which may implement chase combining, incremental redundancy, etc.

Uplink user data traffic 210 and/or downlink user data traffic 206 including one or more traffic channels, such as a physical downlink shared channel (PDSCH) or a physical uplink shared channel (PUSCH) (and, in some examples, system information blocks (SIBs)), may additionally be transmitted between the scheduling entity 202 and the scheduled entity 204. Transmissions of the control and user data traffic information may be organized by subdividing a carrier, in time, into suitable slots.

Furthermore, the scheduled entities 204 may transmit uplink control information 212 including one or more uplink control channels to the scheduling entity 202. Uplink control information may include a variety of packet types and categories, including pilots, reference signals, and information configured to enable or assist in decoding uplink traffic transmissions. In some examples, the control information 212 may include a scheduling request (SR), i.e., request for the scheduling entity 202 to schedule uplink transmissions. Here, in response to the SR transmitted on the control channel 212, the scheduling entity 202 may transmit downlink control information 208 that may schedule the slot for uplink packet transmissions.

Uplink and downlink transmissions may generally utilize a suitable error correcting block code. In a typical block code, an information message or sequence is split up into information blocks, and an encoder at the transmitting device then mathematically adds redundancy to the information message. Exploitation of this redundancy in the encoded information message can improve the reliability of the message, enabling correction for any bit errors that may occur due to the noise. Some examples of error correcting codes include Hamming codes, Bose-Chaudhuri-Hocquenghem (BCH) codes, turbo codes, low-density parity check (LDPC) codes, Walsh codes, and polar codes. Various implementations of scheduling entities 202 and scheduled entities 204 may include suitable hardware and capabilities (e.g., an encoder and/or decoder) to utilize any one or more of these error correcting codes for wireless communication.

In some examples, scheduled entities such as a first scheduled entity 204a and a second scheduled entity 204b may utilize sidelink signals for direct D2D communication. Sidelink signals may include sidelink data 214 and sidelink control 216. Sidelink control information 216 may include a source transmit signal (STS), a direction selection signal (DSS), a destination receive signal (DRS), and a physical sidelink HARQ indicator channel (PSHICH). The DSS/STS may provide for a scheduled entity 204 to request a duration of time to keep a sidelink channel available for a sidelink signal; and the DRS may provide for the scheduled entity 204 to indicate availability of the sidelink channel, e.g., for a requested duration of time. An exchange of DSS/STS and DRS signals (e.g., handshake) may enable different scheduled entities performing sidelink communications to negotiate the availability of the sidelink channel prior to communication of the sidelink data information (traffic) 214. The PSHICH may include HARQ acknowledgment information and/or a HARQ indicator from a destination device, so that the destination may acknowledge data received from a source device.

The channels or carriers illustrated in FIG. 2 are not necessarily all of the channels or carriers that may be utilized between a scheduling entity 202 and scheduled entities 204, and those of ordinary skill in the art will recognize that other channels or carriers may be utilized in addition to those illustrated, such as other traffic, control, and feedback channels.

Resource Structure

Figure 3:
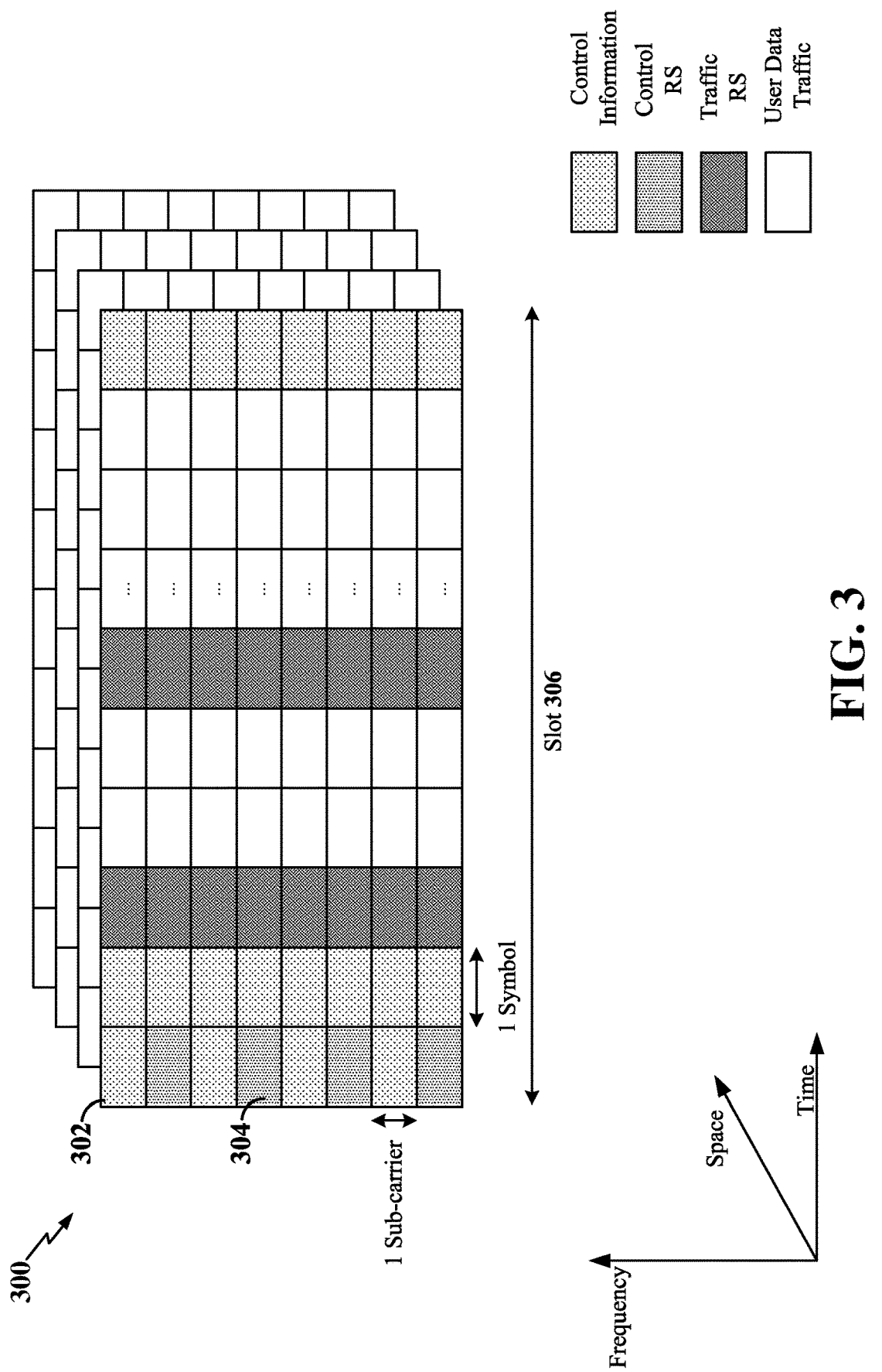
FIG. 3 is a schematic illustration of the resource structure for a radio access network showing time, frequency, and space dimensions

FIG. 3 is a schematic illustration of the resource structure 300 for a radio access network, such as the RAN 100 illustrated in FIG. 1. In some examples, this illustration may represent downlink or uplink wireless resources as they may be allocated in an OFDM system that utilizes multiple-input-multiple-output (MIMO). In some examples, in a 5G NR radio access network, it is anticipated that OFDM may be utilized for DL transmissions, UL transmissions (OFDMA), and/or sidelink transmissions. Furthermore, in a 5G NR radio access network, a waveform other than OFDM may be utilized for UL and/or sidelink transmissions, such as SC-FDMA or DFT-s-OFDMA. It should be further understood that various aspects of the present disclosure may be applied to an SC-FDMA or DFT-s-OFDMA waveform in substantially the same way as described herein below.

MIMO is a multi-antenna technology that exploits multipath signal propagation so that the information-carrying capacity of a wireless link can be multiplied by using multiple antennas at the transmitter and receiver to send multiple simultaneous streams. At the multi-antenna transmitter, a suitable precoding algorithm (scaling the respective streams' amplitude and phase) is applied (in some examples, based on known channel state information). At the multi-antenna receiver, the different spatial signatures of the respective streams (and, in some examples, known channel state information) can enable the separation of these streams from one another.

Massive MIMO is a MIMO system with a very large number of antennas (e.g., greater than an 8×8 array). Further, in a multi-user MIMO (MU-MIMO) system, a base station, in communication with a large number of UEs, can exploit multipath signal propagation to increase overall network capacity by increasing throughput and spectral efficiency, and reducing the required transmission energy.

Referring again to FIG. 3, the resources in a wireless channel may be characterized according to three dimensions: frequency, space, and time. The frequency and time dimensions of an OFDM system may be represented by a two-dimensional grid 302 of resource elements (REs) 304. The REs 304 are defined by the separation of frequency resources into closely spaced narrowband frequency tones or sub-carriers and the separation of time resources into a sequence of OFDM symbols having a given duration. In the example shown in FIG. 3, each RE 304 is represented by a rectangle having the dimensions of one sub-carrier (e.g., 15 kHz bandwidth) by one OFDM symbol. Thus, each RE 304 represents a sub-carrier modulated for the OFDM symbol period by one OFDM data symbol and contains a single complex value representing data from a physical channel or signal. Depending on the modulation utilized in a particular implementation, each RE may represent one or more bits of information. Each OFDM symbol may be modulated using, for example, quadrature phase shift keying (QPSK), 16 quadrature amplitude modulation (QAM) or 64 QAM. Further, by utilizing spatial multiplexing (e.g., with MIMO), a plurality of OFDM streams are represented by separate OFDM resource grids 302 spanning in the space dimension of FIG. 3.

The REs 304 may further be grouped into resource blocks (RB). Each RB may contain any suitable number of consecutive subcarriers in the frequency domain and, in some examples depending on the length of a cyclic prefix (CP) used in each OFDM symbol, any suitable number of consecutive OFDM symbols in the time domain. An RB may be the smallest unit of resources that can be allocated to a UE. Thus, the more RBs scheduled for a UE, and the higher the modulation scheme chosen for the air interface, the higher the data rate for the UE. For example, in LTE networks, an RB includes 12 consecutive sub-carriers in the frequency domain and, for a normal cyclic prefix in each OFDM symbol, 7 consecutive OFDM symbols in the time domain, or 84 resource elements. However, it should be understood that any suitable number of REs 304 may be grouped into a resource block.

In addition, any number of resource blocks (e.g., groups of sub-carriers and OFDM symbols) may be utilized within a slot or mini-slot. In the illustrated example shown in FIG. 3, the resource structure 300 represents a portion of a slot 306, which may be, for example, a downlink-centric slot or an uplink-centric slot. A DL-centric slot is referred to as a DL-centric slot because a majority (or, in some examples, a substantial portion) of the slot includes DL data. An UL-centric slot is referred to as a UL-centric slot because a majority (or, in some examples, a substantial portion) of the slot includes UL data.

In a given DL-centric or UL-centric slot 306, transmission of one or more downlink control channels may be followed by transmission of one or more downlink or uplink traffic channels, in the time dimension. In general, the first N OFDM symbols in a DL-centric or UL-centric slot typically correspond to a downlink control region (DL burst) of the slot that carries downlink control reference signals (Control RSs), such as the cell specific reference signal (C-RS) and channel state information reference signal (CSI-RS), which aid in downlink channel estimation, and downlink control information (Control Information), such as the Physical Control Format Indicator Channel (PCFICH), which carries the Control Format Indicator (CFI), the Physical Hybrid Automatic Repeat Request (HARQ) Indicator Channel (PHICH), and the Physical Downlink Control Channel (PDCCH), which carries Downlink Control Information (DCI).

In the non-limiting example illustrated in FIG. 3, the first two symbols include downlink control reference signals and downlink control information, which may be the same as the control information 208 and/or 216 described above. Accordingly, these symbols may be referred to as the DL burst. Any suitable region of resources in the time, frequency, and space dimensions may be utilized as a DL burst, not necessarily limited to the first two symbols. Moreover, a DL burst need not necessarily be contiguous, and may be included in one, two, or any suitable number of separate regions.

Following the DL burst, the slot 306 may include a traffic region carrying downlink or uplink traffic reference signals (Traffic RSs) and traffic (User Data Traffic), which may be the same as the user data traffic 206, 210, and/or 214 described above. Thus, within the traffic region, REs that carry reference signals (RS) may be interleaved with REs that carry user data traffic. For example, within the traffic region of an uplink-centric slot, one of the RSs may include a sounding reference signal (SRS). The SRS is transmitted from the scheduled entity to the scheduling entity to enable the scheduling entity to estimate the uplink channel quality. The SRS may further be utilized by the scheduling entity for uplink timing estimation.

In addition, one or more of the RSs in the traffic region of an uplink-centric slot or a downlink-centric slot may include a demodulation reference signal (DMRS), which may be used to enable coherent signal demodulation at the receiver. In some examples, the DMRS may be transmitted from a scheduled entity to a scheduling entity at the beginning of the traffic region in an UL-centric slot to enable the scheduling entity to demodulate the subsequently transmitted uplink user data traffic.

At the end of the traffic region, the slot 306 may include an uplink (UL) burst that carries uplink control information. For example, the uplink burst may include a physical uplink control channel (PUCCH), physical random access channel (PRACH) or other suitable uplink control information. In the non-limiting example illustrated in FIG. 3, the last symbol in the slot includes the uplink control information, which may be the same as the control information 212 and/or 216 described above. While the above description only refers to the front resource grid (i.e., not considering the space dimension), it is to be understood that control and traffic information for a plurality of users may be multiplexed in space, frequency, and time.

Control Information Generation

Figure 4:
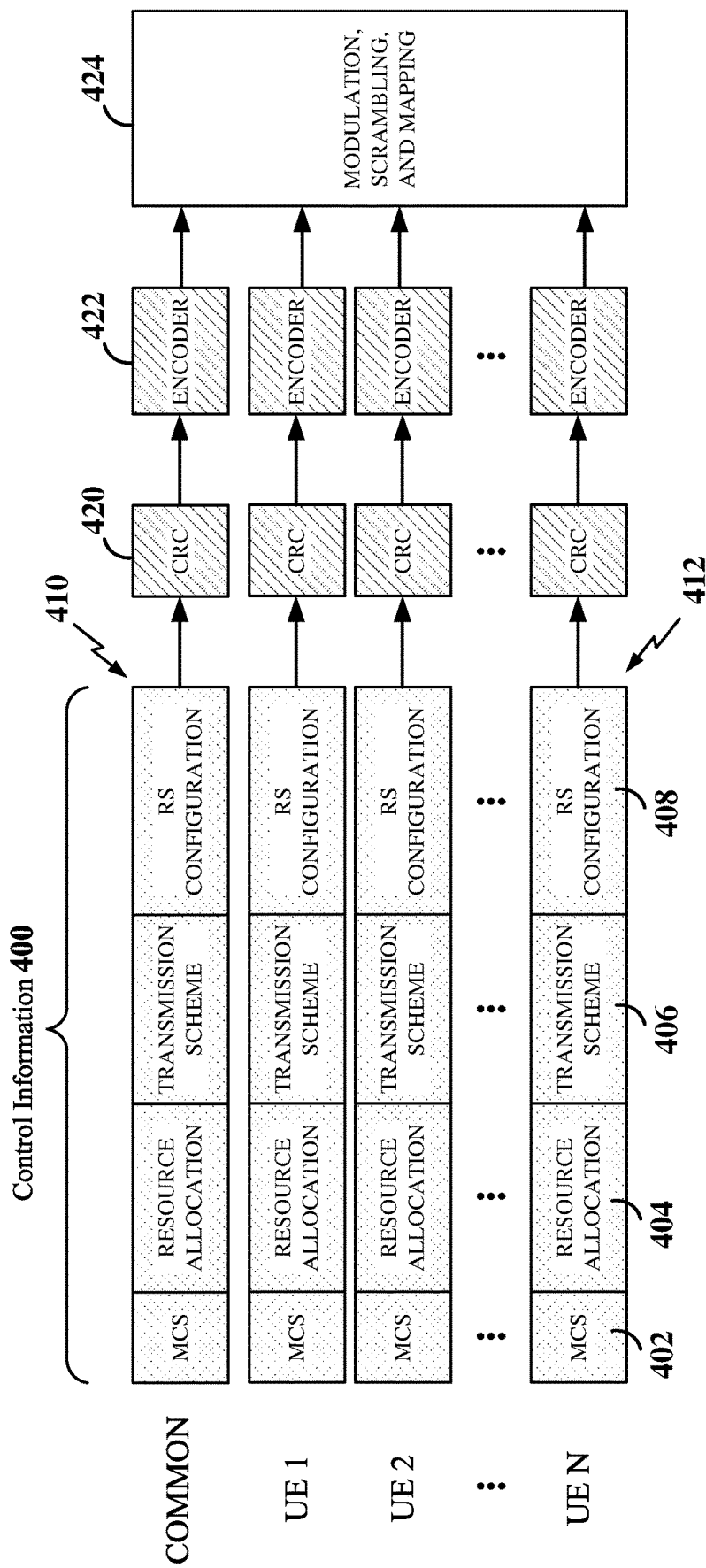
FIG. 4 is a schematic illustration of the generation of a control information transmission according to the prior art.

FIG. 4 is a schematic illustration of the generation of a prior art transmission of control information 400. The control information 400 may include common control information 410 and/or dedicated control information 412. Here, common control information 410 may include control information that may be shared among a group (e.g., a plurality) of UEs, while dedicated control information 412 may include control information intended for a single UE (e.g., one of UE 1, UE 2, . . . UE N). As illustrated here, both common control information 410 for a plurality of UEs and dedicated control information 412 for a given UE may include various fields for different types of information relating to control over user data traffic and traffic RS. For example, as illustrated in FIG. 4, the common control information 410 or a given UE's dedicated control information 412 may include a modulation order and coding scheme (MCS) 402, resource allocation 404 (e.g., time-frequency resources), a transmission scheme 406, a RS configuration 408, etc. Of course, this is only one example and any suitable set of control information 400 may be included. In some examples, each of the common control information 410 and dedicated control information 412 corresponds to respective downlink control information (DCI) transmitted within a respective physical downlink control channel (PDCCH).

Each of the common control information 410 and the dedicated control information 412 for each UE is subjected to a cyclic redundancy check (CRC) calculation block 420 to produce respective CRCs (also referred to herein as CRC information), which in some examples may be scrambled with a group identity (for common control information) or the destination UE's identity (for dedicated control information). For example, a UE may have a radio network temporary identifier (RNTI) or other suitable UE-specific identifier that may be known to the scheduling entity generating the CRCs. The RNTI may be used by the receiving UE to determine whether the control information is intended for that receiving UE or another UE.

The CRC is generated by treating the information bits of the control information 400 as a polynomial in GF(2) (Galois field with two elements) and computing the remainder by dividing the information bits by a generator polynomial in GF(2). A polynomial in GF(2) is a polynomial in a single variable x whose coefficients are 0 or 1. For example, the generator polynomial $x^{16}+x^{12}+x^5+1$ is widely used to compute a 16-bit CRC. In general, to compute a CRC of M bits, M "0" bits are added to an N-bit information message (e.g., N-bit control information) and the resulting polynomial of degree N+M−1 is divided by a generator polynomial of degree M. This produces a remainder polynomial of degree M−1, which has M coefficients (or M bits). These M bits may then be scrambled with the UE's RNTI (or group RNTI) and appended to the N-bit control information bits. Typically, the CRC includes eight, sixteen, or thirty-two bits.

A receiving UE may perform an integrity check or CRC calculation taking its own RNTI into account, so that the CRC would only be verified for control information that includes a CRC scrambled with that UE's RNTI. Similarly, for common control information 410, a group RNTI known to the group of UEs and the scheduling entity may be used to perform an integrity check or CRC calculation. For example, the receiving UE can descramble the M CRC bits using the RNTI, divide all of the N+M (descrambled) received bits by the generator polynomial and check that the M-bit remainder is 0. If the remainder equals 0, the control information may be verified as received correctly. If the remainder does not equal 0, the UE may determine that the control information was not received correctly.

As further illustrated, the control information 400 (e.g., common control information 410 and/or dedicated control information 412 for a plurality of UEs) may be multiplexed into a given transmission of control information. That is, as described above, a downlink transmission from a scheduling entity may include common control information 410 and/or dedicated control information 412 for a plurality of scheduled entities. After adding the CRC to the control information 400, it is encoded by an encoder 422, and then subjected to a modulation, scrambling, and mapping block 424 to modulate, scramble and/or map the encoded control information to resources in the wireless air interface (e.g., see FIG. 3). In some examples, the encoder 422 may be a polar encoder for polar coding the control information block to produce a polar code block that may then be modulated, scrambled, and/or mapped to suitable resources over the wireless air interface.

Polar Codes

Polar codes are linear block error correcting codes invented in 2007 by Erdal Arikan, and currently known to those skilled in the art. In general terms, channel polarization is generated with a recursive algorithm that defines polar codes. Polar codes are the first explicit codes that achieve the channel capacity of symmetric binary-input discrete memoryless channels. That is, polar codes achieve the channel capacity (the Shannon limit) or the theoretical upper bound on the amount of error-free information that can be transmitted on a discrete memoryless channel of a given bandwidth in the presence of noise.

Polar codes may be considered as block codes. In a typical block code, an information message or sequence is split up into information blocks, each block having a length of K bits. An encoder at the transmitting device (scheduling entity) then mathematically adds redundancy to the information message, resulting in codewords having a length of N, where N>K. Here, the code rate R is the ratio between the message length and the block length:i.e., R=K/N. With polar codes, the codeword length N is typically a power of 2 (e.g., 256, 512, 1024, etc.) because the original construction of a polarizing matrix is based on the Kronecker product of $$\begin{bmatrix} 1 & 0 \\ 1 & 1 \end{bmatrix}.$$

For example, a generator matrix (e.g., a polarizing matrix) $G_N$ for generating a polar code with a block length of N can be expressed as:

$$G_N = B_N F^{\otimes n}$$

Here, $B_N$ is the bit-reversal permutation matrix for successive cancellation (SC) decoding (functioning in some ways similar to the interleaver function used by a turbo coder in LTE networks), and $F^{\otimes n}$ is the $n^{th}$ Kronecker power of F. The basic matrix F is $$\begin{bmatrix} 1 & 0 \\ 1 & 1 \end{bmatrix}.$$

The matrix $F^{\otimes n}$ is generated by raising the basic 2×2 matrix F by the $n^{th}$ Kronecker power. This matrix is a lower triangular matrix, in that all the entries above the main diagonal are zero. Because the bit-reversal permutation just changes the index of the rows, the matrix of $F^{\otimes n}$ may be analyzed instead. The matrix of $F^{\otimes n}$ can be expressed as:

$$F^{\otimes n} = \begin{bmatrix} 1 & 0 & 0 & & & 0 & 0 & 0 & 0 \\ 1 & 1 & 0 & \cdots & & 0 & 0 & 0 & 0 \\ 1 & 0 & 1 & & & 0 & 0 & 0 & 0 \\ \vdots & & & \ddots & & & & & \vdots \\ 1 & 0 & 0 & & & 1 & 0 & 0 & 0 \\ 1 & 1 & 0 & & & 1 & 1 & 0 & 0 \\ 1 & 0 & 1 & \cdots & & 1 & 0 & 1 & 0 \\ 1 & 1 & 1 & & & 1 & 1 & 1 & 1 \end{bmatrix}$$

The polar encoder may then generate a polar code block as:

$$x_1^N = u_1^N G_N = u_1^N B_N F^{\otimes n},$$

where $x_1^N = (x_1, x_2, \ldots, x_N)$ is the encoded bit sequence (e.g., bit sequence of the polar code block), and $u_1^N = (u_1, u_2, \ldots, u_N)$ is the encoding bit sequence (e.g., bit sequence of the information block).

Thus, the information bit vector u may include a number (N) of original bits that may be polar coded by the generating matrix $G_N$ to produce a corresponding number (N) of coded bits in the polar codeword x. In some examples, the information bit vector u may include a number of information bits, denoted K, and a number of frozen bits, denoted F. Frozen bits are bits that are set to a suitable predetermined value, such as 0 or 1. Thus, the value of the frozen bits may generally be known at both the transmitting device and the receiving device. The polar encoder, such as the polar encoder 422 shown in FIG. 4, may determine the number of information bits and the number of frozen bits based on the coding rate R. For example, the polar encoder 422 may select a coding rate R from a set of one or more coding rates and select K=N×R bits in the information block to transmit information. The remaining (N−K) bits in the information block may then be fixed as frozen bits F.

In order to determine which information block bits to set as frozen bits, the polar encoder 422 may further analyze the wireless channel over which the polar codeword may be sent. For example, the wireless channel for transmitting the polar codeword may be divided into a set of sub-channels, such that each encoded bit in the polar codeword is transmitted over one of the sub-channels. Thus, each sub-channel may correspond to a particular coded bit location in the polar codeword (e.g., sub-channel-1 may correspond to coded bit location containing coded bit $x_1$). The polar encoder 422 may identify the K best sub-channels for transmitting the information bits and determine the original bit locations in the information block contributing to (or corresponding to) the K best sub-channels. For example, based on the generating matrix, one or more of the original bits of the information block may contribute to each of the coded bits of the polar codeword. Thus, based on the generating matrix, the polar encoder 422 may determine K original bit locations in the information block corresponding to the K best sub-channels, designate the K original bit locations for information bits and designate the remaining original bit locations in the information block for frozen bits.

In some examples, the polar encoder 422 may determine the K best sub-channels by performing density evolution or Gaussian approximation. Density evolution is generally known to those skilled in the art, and therefore the details thereof are not described herein. For example, construction of polar codes based on density evolution is described in R. Mori and T. Tanaka PERFORMANCE OF POLAR CODES WITH THE CONSTRUCTION USING DENSITY EVOLUTION, IEEE Commun. Lett., vol. 13, no. 7, pp. 519-521, July 2009. Gaussian approximation is a lower complexity version of density evolution, and is also generally known to those skilled in the art. For example, construction of polar codes based on Gaussian approximation is described in V. Miloslayskaya, SHORTENED POLAR CODES, IEEE Trans. on Information Theory, June 2015.

The polar encoder 422 may perform density evolution or Gaussian approximation to calculate a respective reliability metric, such as a bit error probability (BEP) and/or log likelihood ratio (LLR), for each of the original bit locations. For example, the LLRs of the coded bit locations are known from the sub-channel conditions (e.g., based on the respective SNRs of the sub-channels). Thus, since one or more of the original bits of the information block may contribute to each of the coded bits of the codeword, the LLRs of each of the original bit locations may be derived from the known LLRs of the coded bit locations by performing density evolution or Gaussian approximation. Based on the calculated original bit location LLRs, the polar encoder 422 may sort the sub-channels and select the K best sub-channels (e.g., "good" sub-channels) to transmit the information bits. The polar encoder 422 may then set the original bit locations of the information block corresponding to the K best sub-channels as including information bits and the remaining original bit locations corresponding to the N-K sub-channels (e.g., "bad" sub-channels) as including frozen bits.

The UE (scheduled entity) may receive a noisy version of x, and has to decode x or, equivalently, u. Polar codes may be decoded with a simple successive cancellation (SC) decoder, which has a decoding complexity of O (N log N) and can achieve Shannon capacity when N is very large. However, for short and moderate block lengths, the error rate performance of polar codes significantly degrades. Therefore, SC-list (SCL) decoding may be utilized to improve the polar coding error rate performance. With SC-list decoding, instead of only keeping one decoding path (as in simple SC decoders), L decoding paths are maintained, where L>1 and L represents the list size. At each decoding stage, the decoder at the UE discards the least probable (worst) decoding paths and keeps only the L best decoding paths. For example, instead of selecting a value $u_i$ at each decoding stage, two decoding paths corresponding to either possible value of $u_i$ are created and decoding is continued in two parallel decoding threads (2*L). To avoid the exponential growth of the number of decoding paths, at each decoding stage, only the L most likely paths are retained. At the end, the decoder at the UE will have a list of L candidates for $u_1^N$, out of which the most likely candidate is selected. Thus, when the decoder completes the SC-list decoding algorithm, the decoder returns a single codeword.

Figure 5:
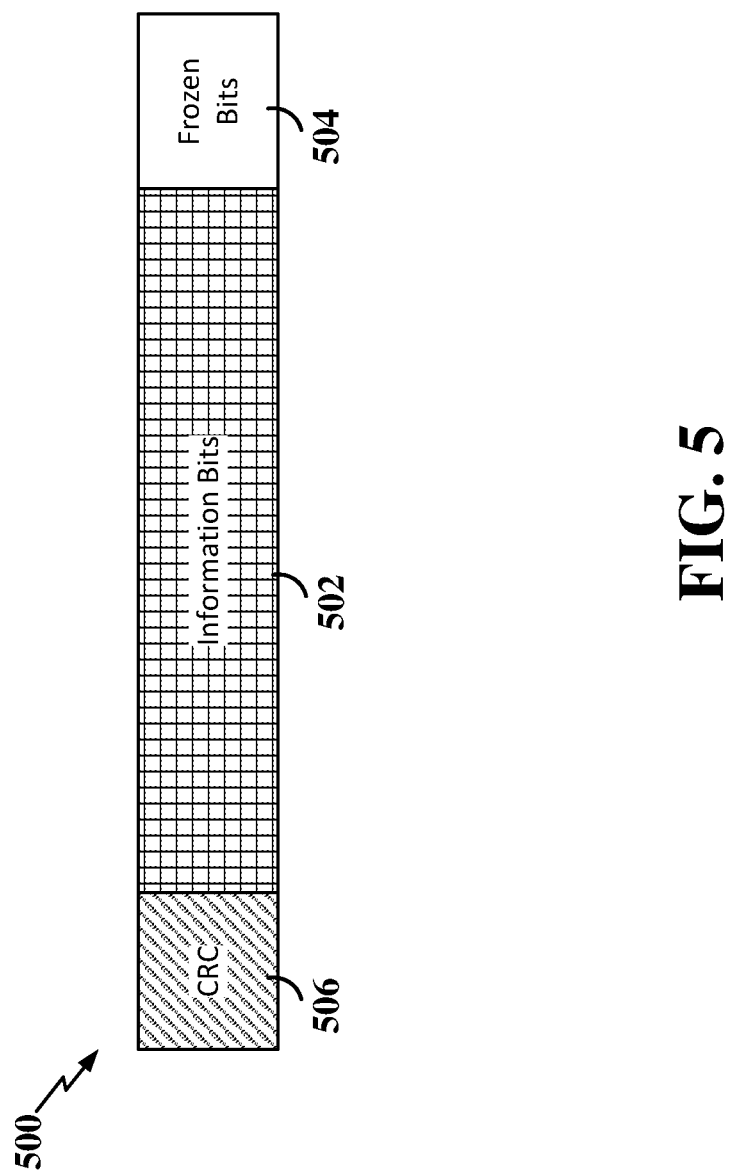
FIG. 5 is a schematic illustration of an information block for polar coding.

FIG. 5 is a schematic illustration of an information block 500 to be polar coded that includes a plurality of information bits 502 and a plurality of frozen bits 504. The information block 500 further includes CRC information 506 (e.g., CRC bits) that may be utilized by the scheduled entity (e.g., UE) to perform CRC-aided successive cancellation list (CA-SCL) decoding. In CA-SCL, the CRC is utilized to select the output codeword from the L candidates (also referred to herein as information block candidates). For example, at the scheduling entity (transmitting device), the polar encoder (e.g., the polar encoder 422 shown in FIG. 4) may compute the CRC bits 506, as described above, and append the CRC bits 506 to the information bits 502. At the scheduled entity (receiving device), a polar decoder may use the CRC information 506 to test each of the L information block candidates for errors. If more than one information block candidate passes (e.g., produces a remainder of 0), the polar decoder may select the most probable candidate among those that pass as the information block.

In some examples, the polar encoder may place the CRC information 506 within the best sub-channels (highest reliability sub-channels) to increase the likelihood that the correct output codeword is selected at the receiver. For example, as indicated above, the polar encoder may determine K original bit locations in the information block 500 corresponding to the K best sub-channels for both the CRC and the information bits. The polar encoder may then determine the M best sub-channels from the K best sub-channels, designate the M original bit locations for CRC bits 506, designate the K-M original bit locations for information bits 502 and designate the remaining original bit locations in the information block for frozen bits 504. In this example, instead of having K information bits, the information block 500 may include only K-M information bits 502. To maintain the same number of information bits, K may be increased, thus decreasing the number of frozen bits 504, which may decrease the error-correction capability of the polar code.

In addition to the CRC information 506 utilized for polar decoding (list decoding CRC), the information bits 502 themselves may further include a CRC (e.g., an integrity CRC, not shown) to verify the integrity of the information bits. In various aspects of the disclosure, the information bits 502 may correspond to control information, and the integrity CRC may be scrambled with an RNTI (group or UE-specific) to enable the receiving UE to determine whether the control information is intended for that receiving UE.

Polar Coding Control Information and CRC Information

Figure 6:
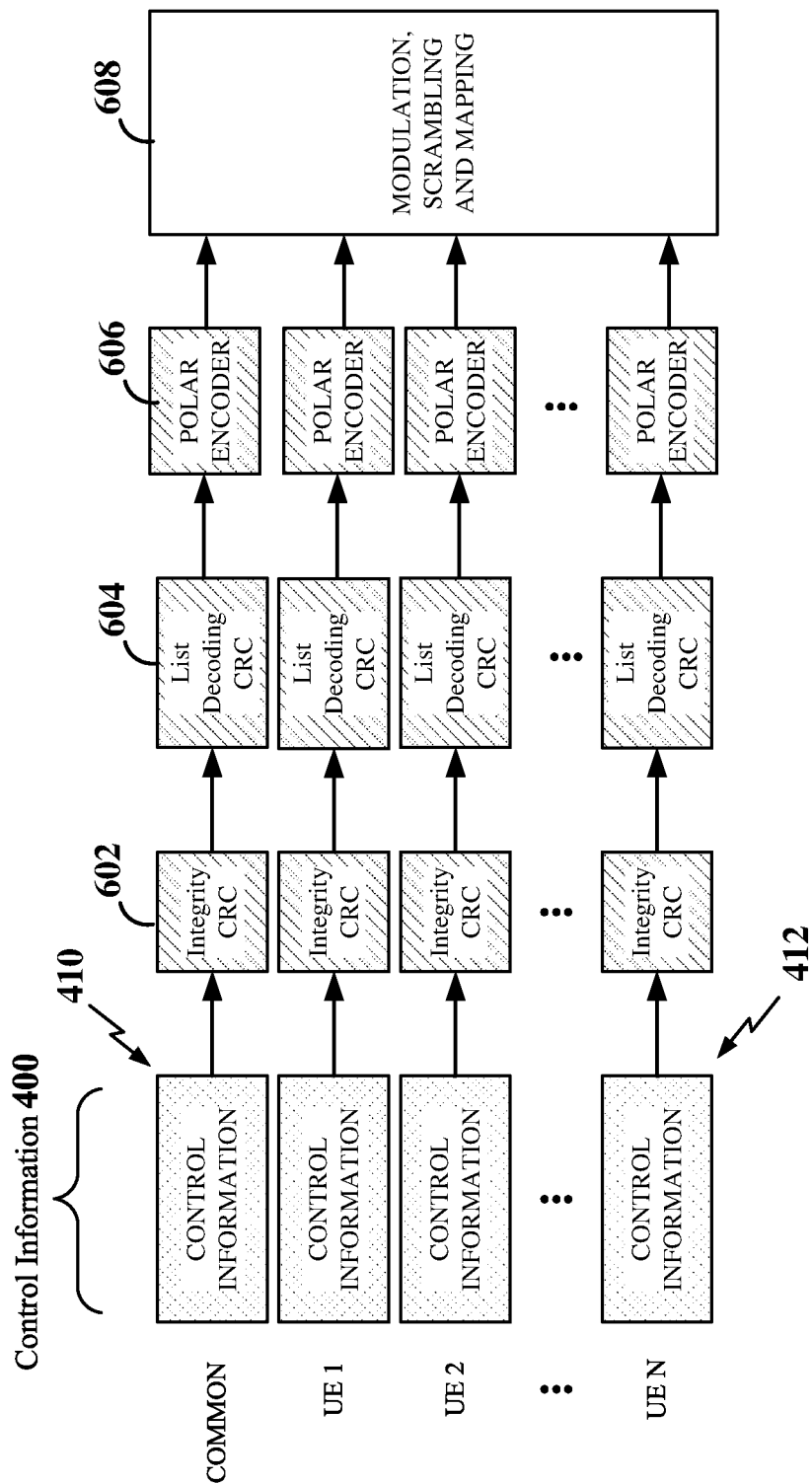
FIG. 6 is a schematic illustration of the generation of a control information transmission utilizing polar coding.

FIG. 6 is a schematic illustration of the generation of a transmission for CA-SCL decoding of polar codes that includes control information 400. As indicated above, the control information 400 may include common control information 410 and/or dedicated control information 412. Many of the aspects and features of the example shown in FIG. 6 are the same as those described above in relation to FIG. 4. Those aspects that are the same are not detailed below, for brevity.

As illustrated in FIG. 6, each of the common control information 410 and the dedicated control information 412 for each UE (e.g., UE 1, UE 2, . . . , UE N) is subjected to two cyclic redundancy check (CRC) calculation blocks. A first CRC calculation block 602 (integrity CRC) computes integrity CRC bits, which in some examples may be scrambled with a group identity (for common control information 410) or the destination UE's identity (for dedicated control information 412), as described above. The integrity CRC bits may be used to verify the integrity of the control information at the receiving UE and to ascertain whether the control information is intended for that receiving UE. A second CRC calculation block 604 (list decoding CRC) computes list decoding CRC bits, which may be utilized by the receiving UE in CA-SCL decoding of polar codes.

After adding the integrity CRC bits and the list decoding CRC bits to the control information 400, each control information 400 (together with the integrity CRC bits and list decoding CRC bits) is separately polar encoded by a respective polar encoder 606 to produce respective polar code blocks, which may then be subjected to a modulation, scrambling, and mapping block 608 to modulate, scramble, and/or map the polar code blocks to resources in the wireless air interface. In some examples, each integrity CRC may include sixteen bits, and each list CRC may also include sixteen bits, which may increase the overhead of the control information and decrease the error-correction capability of the polar code (e.g., if the number of frozen bits is reduced to accommodate additional information bits in the information block).

Various aspects of the present disclosure provide for a transmitting device (e.g., scheduling entity) to generate a single combined CRC for polar coded control information to be utilized for both CA-SCL decoding of the polar coded control information and verification of the control information. In this way, the total number of CRC bits may be reduced, thus reducing the CRC overhead. In addition, the performance (e.g., Block Error Rate) may be improved (increased) by increasing the number of information bits and frozen bits in the polar coded control information block. Furthermore, the encoding process may be simplified by requiring only a CRC calculation over the control information.

Figure 7:
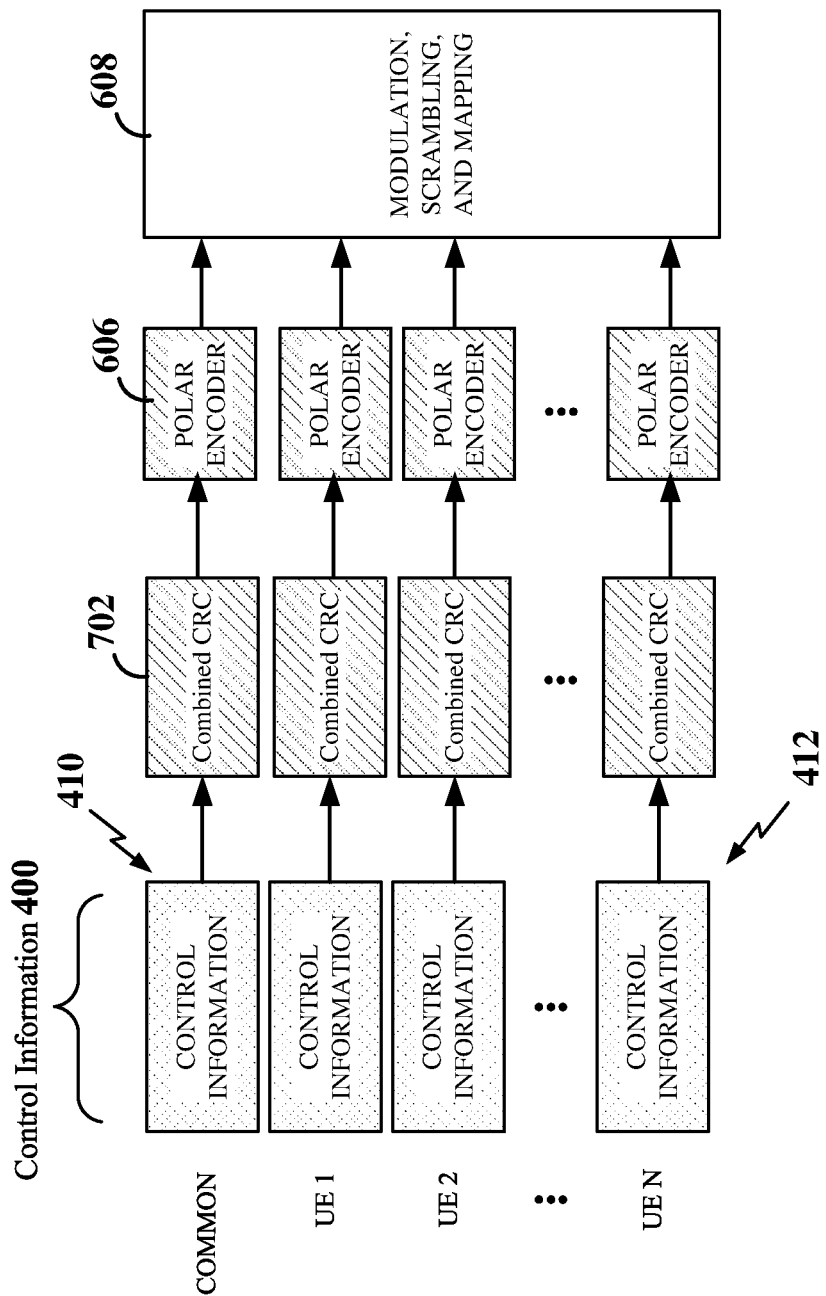
FIG. 7 is a schematic illustration of the generation of a control information transmission utilizing polar coding and a reduced cyclic redundancy check (CRC) according to some aspects of the disclosure.

FIG. 7 is a schematic illustration of the generation of a transmission of control information 400 for CA-SCL decoding of polar codes according to some aspects of the disclosure. As illustrated in FIG. 7, each of the common control information 410 and the dedicated control information 412 for each UE (e.g., UE 1, UE 2, . . . UE N) is subjected to only a single combined cyclic redundancy check (CRC) calculation block 702 (Combined CRC block). The Combined CRC block 702 computes a number of CRC bits selected to jointly decode and verify the integrity of the control information 400 at the receiver (scheduled entity). For example, the scheduled entity may utilize the entire number of CRC bits to perform CA-SCL decoding and may then utilize the same entire number of CRC bits to perform an integrity check on the decoded control information.

In various aspects of the disclosure, the number of CRC bits may be selected based on at least the list size L utilized by the receiving UE (scheduled entity) for CA-SCL decoding of the polar coded control information. In some examples, the number of CRC bits may be equal to the sum of a number of integrity check CRC bits (M) and a number of CA-SCL CRC bits (J), where the number of CA-SCL CRC bits (J) is selected based on the list size. For example, the number of CA-SCL CRC bits may be equal to the binary logarithm of the list size (e.g., $J=\log_2 L$). Thus, the number of CA-SCL CRC bits may be reduced from the normal 16 CA-SCL CRC bits to 3 CRC bits for L=8 and to 5 CRC bits for L=32. Thus, if the number of integrity check CRC bits remains 16, the total number of CRC bits may be reduced from 32 CRC bits to 19 CRC bits for L=8 and to 21 CRC bits for L=32.

By selecting the number of CA-SCL CRC bits as the binary logarithm of the list size, the false positive rate may remain the same. Here, the false positive rate refers to the ratio of the number of incorrect CRC check passes (e.g., CRC checks that pass in error) to the total number of CRC checks. For example, the false positive rate ($P_f$) for an M-bit CRC added to a control information block when list decoding is not used at the receiver may be expressed as: $P_f = 2^{-M}$. For a random list decoder, where L randomly chosen codewords are checked against the M-bit CRC, the false positive rate may be expressed as:

$$P_f(L) = 1 - (1-P_f)^L \approx L \times 2^{-M}.$$

The effective number of CRC bits left for pruning (e.g., for performing CA-SCL) then becomes:

$$-\log_2 P_f(L) \approx M - \log_2 L$$

Thus, to keep the same false positive rate when utilizing the CRC bits for CA-SCL, an additional $\log_2 L$ CA-SCL CRC bits should be added to the integrity check CRC bits.

Based on the number of selected CRC bits (e.g., M+J) for a particular N-bit control information message, the Combined CRC block 702 may compute a CRC of M+J bits by adding M+J "0" bits to the N-bit control information message, and the resulting polynomial of degree N+(M+J)−1 may be divided by a generator polynomial of degree M+J. This produces a remainder polynomial of degree (M+J)−1, which has M+J coefficients (or M+J bits). These M+J bits (e.g., combined CRC bits) may then be scrambled with the UE's RNTI (or group RNTI) and appended to the N-bit control information bits.

After adding the combined CRC bits to the control information, each control information 400 (together with the combined CRC bits) is separately polar encoded by the respective polar encoder 606, and then modulated, scrambled, and/or mapped to resources in the wireless air interface by the modulation, scrambling, and mapping block 608. In some examples, the combined CRC information may be placed within the best sub-channels for the information block, as described above. For example, as indicated above, the polar encoder 606 may determine a reliability metric (e.g., LLR) for each of the original bit locations and allocate the sub-channels having the highest reliability metrics to the combined CRC information. For example, the polar encoder may identify the K original bit locations in the information block corresponding to the K best sub-channels for both the CRC bits and the information bits. The polar encoder 606 may then determine the M+J best sub-channels from the K best sub-channels, designate the M+J original bit locations for CRC bits, designate the K−(M+J) original bit locations for information bits and designate the remaining original bit locations in the information block for frozen bits.

In other examples, the combined CRC information may be distributed among the sub-channels to support early termination. For example, the polar encoder 606 may allocate the CRC information to a portion of the sub-channels, where the portion of sub-channels are distributed throughout the N sub-channels or the K best sub-channels.

Scheduling Entity

Figure 8:
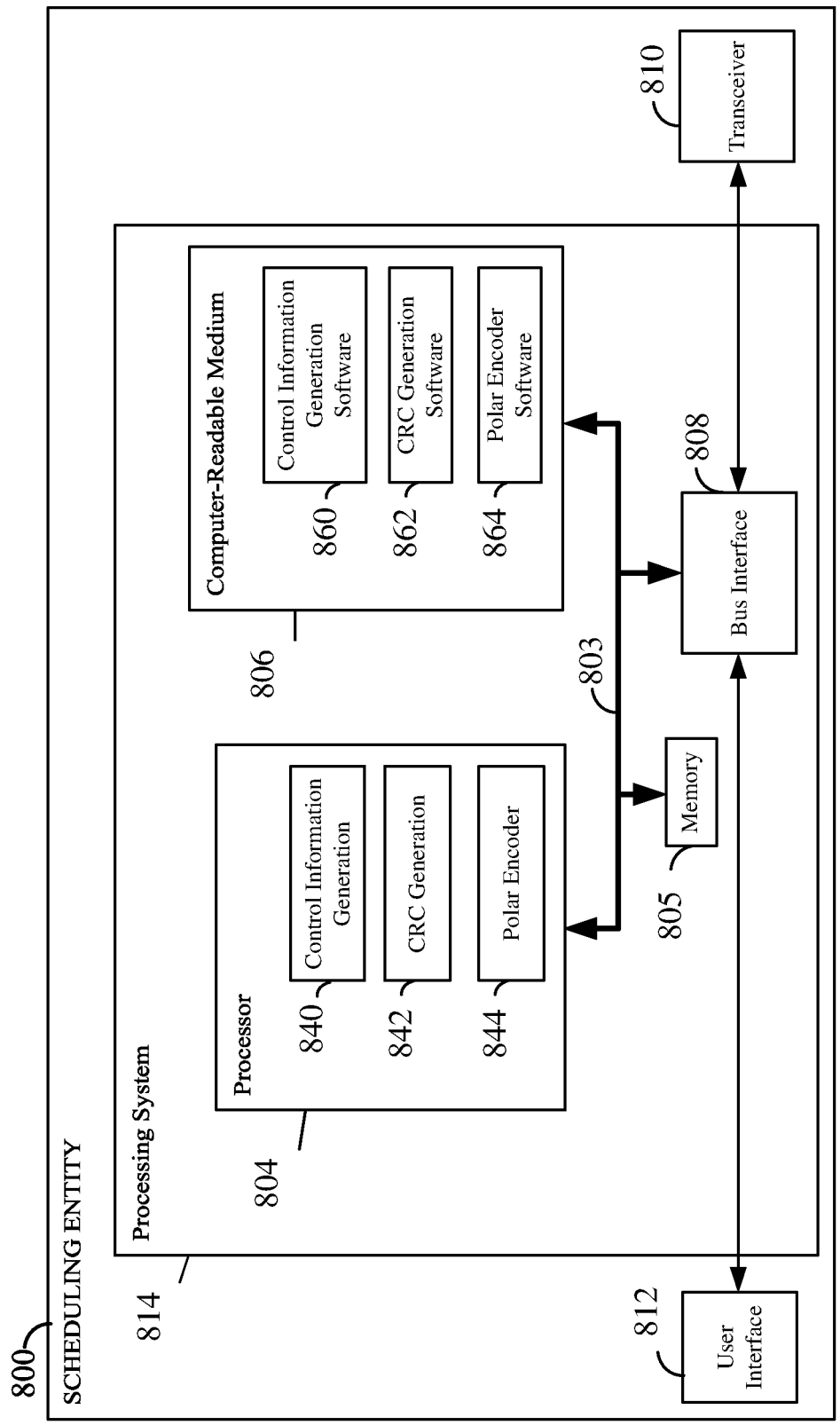
FIG. 8 is a block diagram illustrating an example of a hardware implementation for a scheduling entity apparatus employing a processing system.

FIG. 8 is a block diagram illustrating an example of a hardware implementation for a scheduling entity 800 employing a processing system 814. For example, the scheduling entity 800 may be a user equipment (UE) as illustrated in any one or more of FIGS. 1 and/or 2. In another example, the scheduling entity 800 may be a base station as illustrated in any one or more of FIGS. 1 and/or 2.

The scheduling entity 800 may be implemented with a processing system 814 that includes one or more processors 804. Examples of processors 804 include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In various examples, the scheduling entity 800 may be configured to perform any one or more of the functions described herein. That is, the processor 804, as utilized in a scheduling entity 800, may be used to implement any one or more of the processes and procedures described below.

In this example, the processing system 814 may be implemented with a bus architecture, represented generally by the bus 802. The bus 802 may include any number of interconnecting buses and bridges depending on the specific application of the processing system 814 and the overall design constraints. The bus 802 communicatively couples together various circuits including one or more processors (represented generally by the processor 804), a memory 805, and computer-readable media (represented generally by the computer-readable medium 806). The bus 802 may also link various other circuits such as timing sources, peripherals, voltage regulators, and power management circuits, which are well known in the art, and therefore, will not be described any further. A bus interface 808 provides an interface between the bus 802 and a transceiver 810. The transceiver 810 provides a communication interface or means for communicating with various other apparatus over a transmission medium. Depending upon the nature of the apparatus, a user interface 812 (e.g., keypad, display, speaker, microphone, joystick) may also be provided.

The processor 804 is responsible for managing the bus 802 and general processing, including the execution of software stored on the computer-readable medium 806. The software, when executed by the processor 804, causes the processing system 814 to perform the various functions described below for any particular apparatus. The computer-readable medium 806 and the memory 805 may also be used for storing data that is manipulated by the processor 804 when executing software.

One or more processors 804 in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

The software may reside on a computer-readable medium 806. The computer-readable medium 806 may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. The computer-readable medium 806 may reside in the processing system 814, external to the processing system 814, or distributed across multiple entities including the processing system 814. The computer-readable medium 806 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

In some aspects of the disclosure, the processor 804 may include circuitry configured for various functions. For example, the processor 804 may include control information generation circuitry 840 configured for various functions, including, for example, generating an information block containing control information (e.g., common or dedicated downlink control information (DCI)) for a scheduled entity. For example, the control information generation circuitry 840 may be configured to implement one or more of the functions described in relation to FIGS. 4-7 and/or 10. The control information generation circuitry 840 may operate in coordination with control information generation software 860.

The processor 804 may further include CRC generation circuitry 842 configured for various functions, including, for example, selecting a number of CRC bits to jointly decode and verify the integrity of the control information at the scheduled entity. In some examples, the number of CRC bits is selected based on at least a list size L utilized in successive-cancellation list (SCL) decoding at the scheduled entity. The CRC generation circuitry 842 may further be configured to generate combined CRC information, including the selected number of CRC bits, for the information block. For example, the CRC generation circuitry 842 may be configured to implement one or more of the functions described in relation to FIGS. 4-7 and/or 10. The CRC generation circuitry 842 may operate in coordination with control information generation software 862.

The processor 804 may further include polar encoder circuitry 844 configured for various functions, including, for example, polar encoding an information block containing the control information and combined CRC information for a wireless transmission. For example, the polar encoder circuitry 844 may be configured to implement one or more of the functions described below in relation to FIGS. 4-7 and/or 10. The polar encoder circuitry 844 may operate in coordination with polar encoder software 864.

Scheduled Entity

Figure 9:
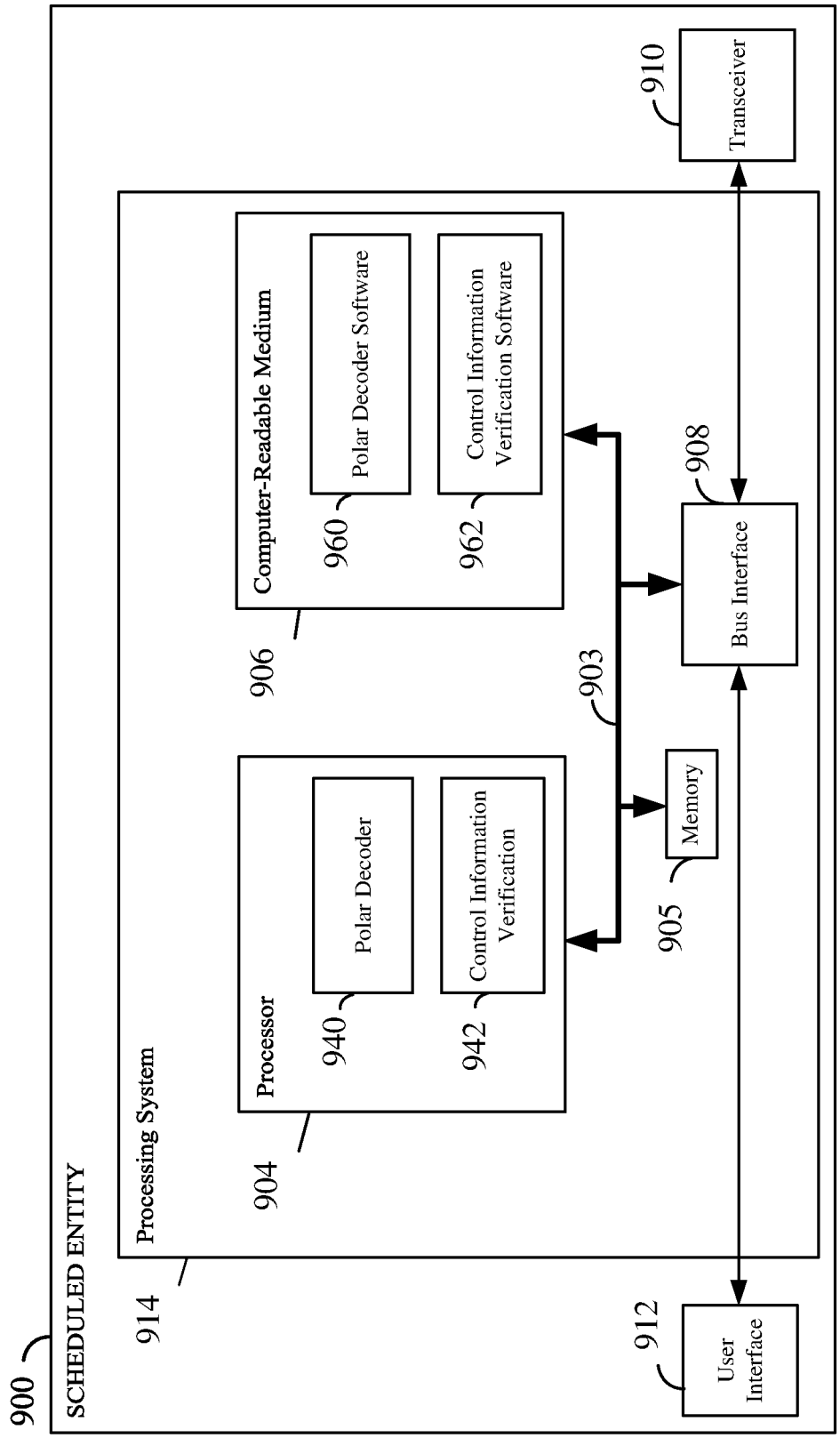
FIG. 9 is a block diagram illustrating an example of a hardware implementation for a scheduled entity apparatus employing a processing system.

FIG. 9 is a conceptual diagram illustrating an example of a hardware implementation for an exemplary scheduled entity 900 employing a processing system 914. In accordance with various aspects of the disclosure, an element, or any portion of an element, or any combination of elements may be implemented with a processing system 914 that includes one or more processors 904. For example, the scheduled entity 900 may be a user equipment (UE) as illustrated in any one or more of FIGS. 1 and/or 2.

The processing system 914 may be substantially the same as the processing system 814 illustrated in FIG. 8, including a bus interface 908, a bus 902, memory 905, a processor 904, and a computer-readable medium 906. Furthermore, the scheduled entity 900 may include a user interface 912 and a transceiver 910 substantially similar to those described above in FIG. 8. That is, the processor 904, as utilized in a scheduled entity 900, may be used to implement any one or more of the processes described below.

In some aspects of the disclosure, the processor 904 may include decoder circuitry 940 configured for various functions, including, for example, polar decoding a polar code block containing control information and combined CRC information for the scheduled entity received over a wireless communication interface. In some examples, the decoder circuitry 940 may utilize the combined CRC information to polar decode the polar code block while implementing a CA-SCL decoding algorithm. For example, the polar decoder circuitry 940 may be configured to implement one or more of the functions described in relation to FIGS. 5-7 and/or 11. The decoder circuitry 940 may operate in coordination with decoder software 960.

The processor 904 may further include control information verification circuitry 942 configured for various functions, including, for example, verifying the integrity of the decoded control information utilizing the same combined CRC information as that utilized during decoding. For example, the control information verification circuitry 942 may be configured to implement one or more of the functions described in relation to FIGS. 4-7 and/or 11. The control information verification circuitry 942 may operate in coordination with control information verification software 962.

Polar Encoding with Combined CRC

Figure 10:
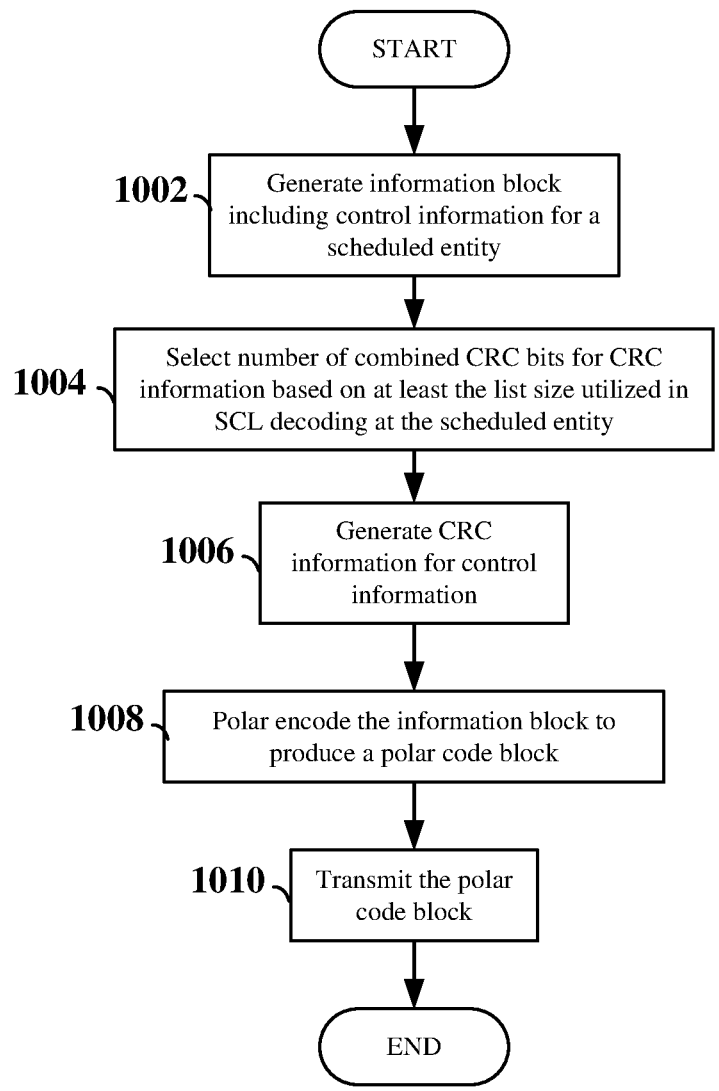
FIG. 10 is a flow chart illustrating an exemplary process for polar encoding control information with a combined CRC according to some aspects of the disclosure.

FIG. 10 is a flow chart illustrating an exemplary process 1000 for polar encoding control information with a combined CRC according to some aspects of the disclosure. As described below, some or all illustrated features may be omitted in a particular implementation within the scope of the present disclosure, and some illustrated features may not be required for implementation of all embodiments. In some examples, the process 1000 may be carried out by the scheduling entity 800 illustrated in FIG. 8. In some examples, the process 1000 may be carried out by any suitable apparatus or means for carrying out the functions or algorithm described below.

At block 1002, the scheduling entity may generate an information block including control information for a scheduled entity (e.g., common or dedicated control information). For example, the control information may correspond to the control information described above and illustrated in FIGS. 4, 6, and/or 7. For example, the control information generation circuitry 840 shown and described above in connection with FIG. 8 may generate the control information.

At block 1004, the scheduling entity may select a number of cyclic redundancy check (CRC) bits for the information block based on at least a list size L utilized in successive-cancellation list (SCL) decoding at the scheduled entity. For example, the number of CRC bits may be equal to the sum of a number of integrity check CRC bits (M) and a number of CRC-aided SCL (CA-SCL) CRC bits (J), where the number of CA-SCL CRC bits (J) is selected based on the list size. In some examples, the number of CA-SCL CRC bits may be equal to the binary logarithm of the list size (e.g., $J=\log_2 L$). At block 1006, the scheduling entity may generate CRC information containing the selected number of CRC bits (e.g., combined CRC bits) for the information block and append the combined CRC bits to the information block. Here, the CRC information may be based on the control information, and further, based on a group or UE-specific identifier (e.g., an RNTI). For example, the CRC generation circuitry 842 shown and described above in connection with FIG. 8 may generate the combined CRC.

At block 1008, the scheduling entity may polar encode the information block including the combined CRC bits. For example, the polar encoder circuitry 844 shown and described above in connection with FIG. 8 may polar encode the information block to produce a polar code block containing the control information and combined CRC bits. At block 1010, the scheduling entity may transmit the polar code block over the air interface. For example, the scheduling entity may utilize the transceiver 810 shown in FIG. 8 to transmit the polar code block over the air interface.

Figure 11:
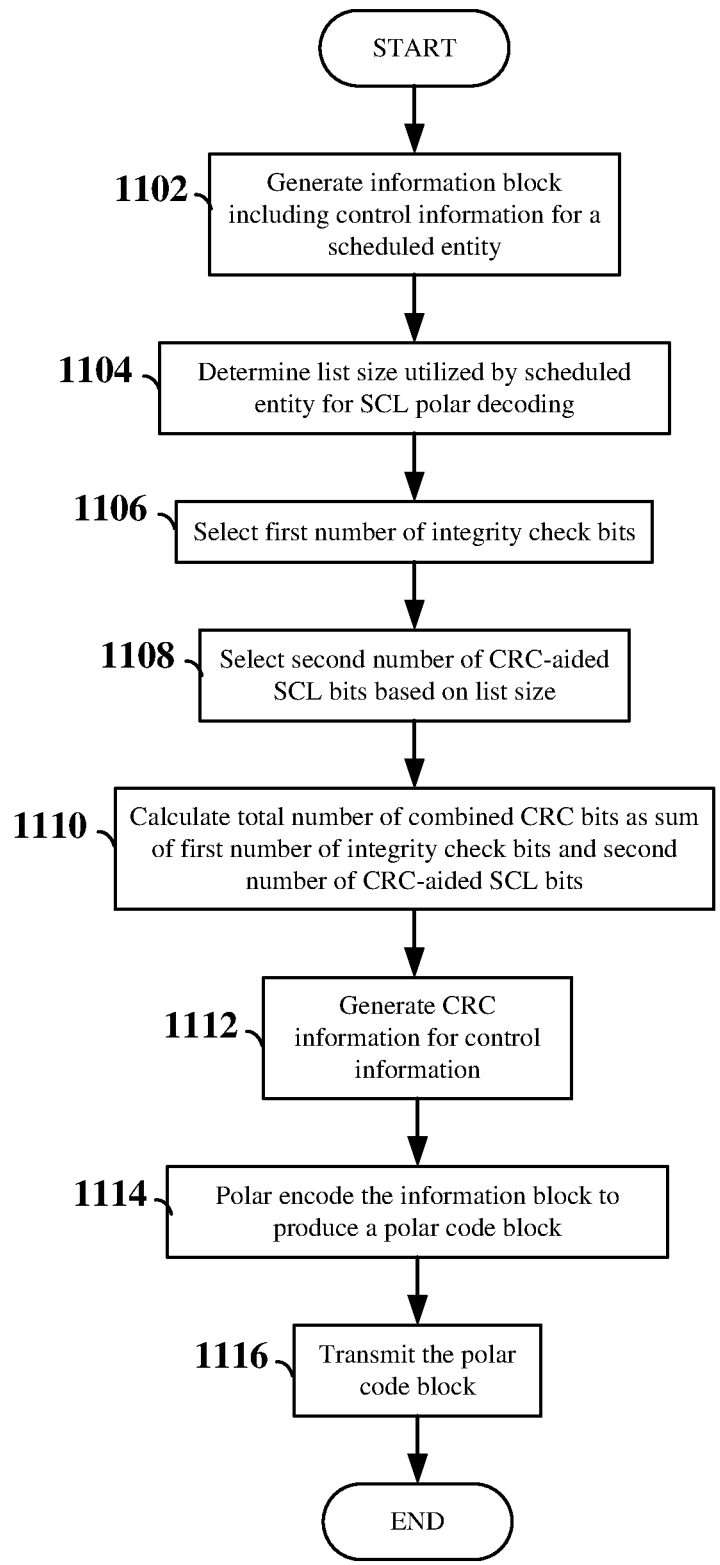
FIG. 11 is a flow chart illustrating another exemplary process for polar encoding control information with a combined CRC according to some aspects of the disclosure.

FIG. 11 is a flow chart illustrating another exemplary process 1100 for polar encoding control information with a combined CRC according to some aspects of the disclosure. As described below, some or all illustrated features may be omitted in a particular implementation within the scope of the present disclosure, and some illustrated features may not be required for implementation of all embodiments. In some examples, the process 1100 may be carried out by the scheduling entity 800 illustrated in FIG. 8. In some examples, the process 1100 may be carried out by any suitable apparatus or means for carrying out the functions or algorithm described below.

At block 1102, the scheduling entity may generate an information block including control information for a scheduled entity (e.g., common or dedicated control information). For example, the control information may correspond to the control information described above and illustrated in FIGS. 4, 6, and/or 7. For example, the control information generation circuitry 840 shown and described above in connection with FIG. 8 may generate the control information.

At block 1104, the scheduling entity may determine a list size utilized by the scheduled entity for SCL polar decoding. In some examples, the scheduled entity may provide the list size to the scheduling entity during connection establishment or in response to a request by the scheduling entity. In other examples, the list size may be set for the cell or network and may be transmitted from the scheduling entity to the scheduled entity. For example, the CRC generation circuitry 842 shown and described above in connection with FIG. 8 may determine the list size.

At block 1106, the scheduling entity may select a first number of integrity check bits for use by the scheduled entity in verifying the integrity of the received control information. In some examples, the number of integrity check bits may include eight, sixteen, or thirty-two bits. At block 1108, the scheduling entity may select a second number of CRC-aided SCL bits based on the list size. In some examples, the second number of CRC-aided SCL bits is equal to the binary logarithm of the list size. At block 1110, the scheduling entity may then calculate a total number of combined CRC bits as a sum of the first number of integrity check bits and the second number of CRC-aided SCL bits. For example, the CRC generation circuitry 842 shown and described above in connection with FIG. 8 may determine the first number of integrity check bits, the second number of CRC-aided SCL bits, and the total number of combined CRC bits.

At block 1112, the scheduling entity may generate CRC information containing the total number of combined CRC bits for the information block and append the combined CRC bits to the information block. Here, the CRC information may be based on the control information, and further, based on a group or UE-specific identifier (e.g., an RNTI). For example, the CRC generation circuitry 842 shown and described above in connection with FIG. 8 may generate the combined CRC.

At block 1114, the scheduling entity may polar encode the information block including the combined CRC bits. For example, the polar encoder circuitry 844 shown and described above in connection with FIG. 8 may polar encode the information block to produce a polar code block containing the control information and combined CRC bits. At block 1116, the scheduling entity may transmit the polar code block over the air interface. For example, the scheduling entity may utilize the transceiver 810 shown in FIG. 8 to transmit the polar code block over the air interface.

Figure 12:
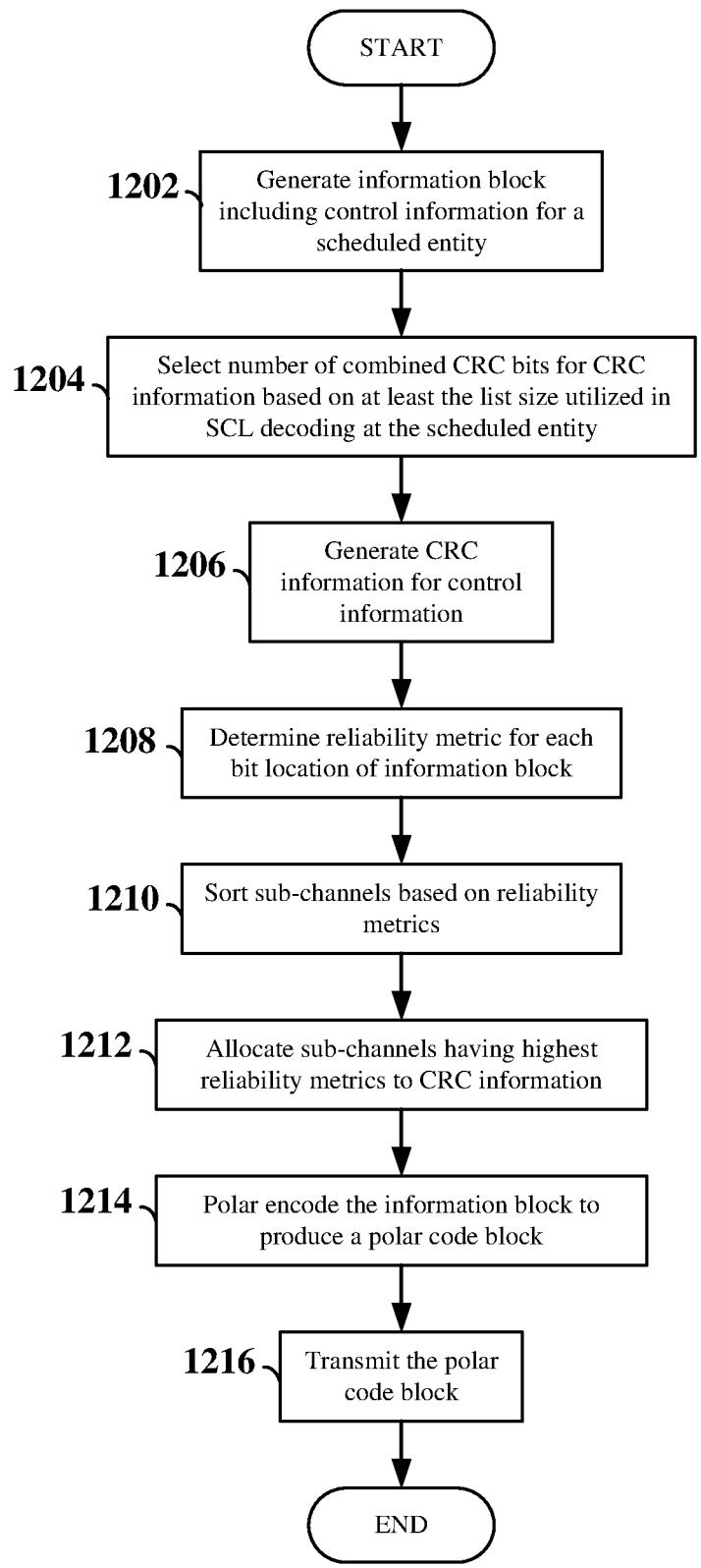
FIG. 12 is a flow chart illustrating another exemplary process for polar encoding control information with a combined CRC according to some aspects of the disclosure.

FIG. 12 is a flow chart illustrating another exemplary process 1200 for polar encoding control information with a combined CRC according to some aspects of the disclosure. As described below, some or all illustrated features may be omitted in a particular implementation within the scope of the present disclosure, and some illustrated features may not be required for implementation of all embodiments. In some examples, the process 1200 may be carried out by the scheduling entity 800 illustrated in FIG. 8. In some examples, the process 1200 may be carried out by any suitable apparatus or means for carrying out the functions or algorithm described below.

At block 1202, the scheduling entity may generate an information block including control information for a scheduled entity (e.g., common or dedicated control information). For example, the control information may correspond to the control information described above and illustrated in FIGS. 4, 6, and/or 7. For example, the control information generation circuitry 840 shown and described above in connection with FIG. 8 may generate the control information.

At block 1204, the scheduling entity may select a number of cyclic redundancy check (CRC) bits for the information block based on at least a list size L utilized in successive-cancellation list (SCL) decoding at the scheduled entity. For example, the number of CRC bits may be equal to the sum of a number of integrity check CRC bits (M) and a number of CRC-aided SCL (CA-SCL) CRC bits (J), where the number of CA-SCL CRC bits (J) is selected based on the list size. In some examples, the number of CA-SCL CRC bits may be equal to the binary logarithm of the list size (e.g., $J=\log_2 L$). At block 1206, the scheduling entity may generate CRC information containing the selected number of CRC bits (e.g., combined CRC bits) for the information block and append the combined CRC bits to the information block. Here, the CRC information may be based on the control information, and further, based on a group or UE-specific identifier (e.g., an RNTI). For example, the CRC generation circuitry 842 shown and described above in connection with FIG. 8 may generate the combined CRC.

At block 1208, the scheduling entity may determine a respective reliability metric, such as a bit error probability (BEP) and/or log likelihood ratio (LLR), for each of the original bit locations of the information block. For example, the LLRs of the coded bit locations may be known from the sub-channel conditions (e.g., based on the respective SNRs of the sub-channels). Thus, since one or more of the original bits of the information block may contribute to each of the coded bits of the codeword, the LLRs of each of the original bit locations may be derived from the known LLRs of the coded bit locations by performing density evolution or Gaussian approximation. Based on the calculated original bit location LLRs, at block 1210, the scheduling entity may sort the sub-channels in order from highest reliability metrics to lowest reliability metrics. At block 1212, the scheduling entity may allocate the sub-channels having the highest reliability metrics to the CRC information and then set the original bit locations of the information block corresponding to the highest reliability sub-channels as including the CRC information. For example, the CRC generation circuitry 842 shown and described above in connection with FIG. 8 may determine the reliability metrics, sort the sub-channels based on the reliability metrics, and allocated the sub-channels with the highest reliability metrics to the CRC information.

At block 1214, the scheduling entity may polar encode the information block including the combined CRC bits. For example, the polar encoder circuitry 844 shown and described above in connection with FIG. 8 may polar encode the information block to produce a polar code block containing the control information and combined CRC bits. At block 1216, the scheduling entity may transmit the polar code block over the air interface. For example, the scheduling entity may utilize the transceiver 810 shown in FIG. 8 to transmit the polar code block over the air interface.

Figure 13:
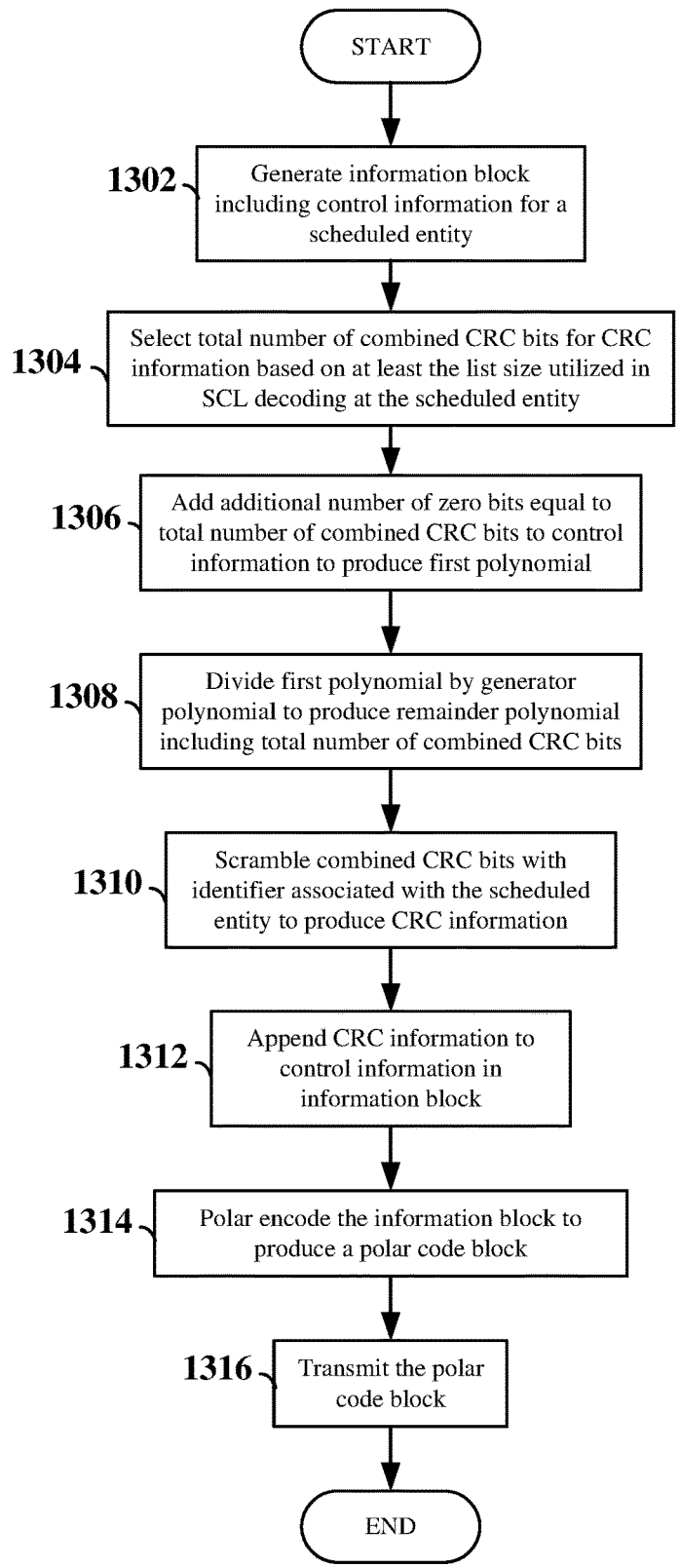
FIG. 13 is a flow chart illustrating another exemplary process for polar encoding control information with a combined CRC according to some aspects of the disclosure.

FIG. 13 is a flow chart illustrating another exemplary process 1300 for polar encoding control information with a combined CRC according to some aspects of the disclosure. As described below, some or all illustrated features may be omitted in a particular implementation within the scope of the present disclosure, and some illustrated features may not be required for implementation of all embodiments. In some examples, the process 1300 may be carried out by the scheduling entity 800 illustrated in FIG. 8. In some examples, the process 1300 may be carried out by any suitable apparatus or means for carrying out the functions or algorithm described below.

At block 1302, the scheduling entity may generate an information block including control information for a scheduled entity (e.g., common or dedicated control information). For example, the control information may correspond to the control information described above and illustrated in FIGS. 4, 6, and/or 7. For example, the control information generation circuitry 840 shown and described above in connection with FIG. 8 may generate the control information.

At block 1304, the scheduling entity may select a number of cyclic redundancy check (CRC) bits for the information block based on at least a list size L utilized in successive-cancellation list (SCL) decoding at the scheduled entity. For example, the number of CRC bits may be equal to the sum of a number of integrity check CRC bits (M) and a number of CRC-aided SCL (CA-SCL) CRC bits (J), where the number of CA-SCL CRC bits (J) is selected based on the list size. In some examples, the number of CA-SCL CRC bits may be equal to the binary logarithm of the list size (e.g., $J=\log_2 L$). For example, the CRC generation circuitry 842 shown and described above in connection with FIG. 8 may select the number of combined CRC bits for the CRC information.

At block 1306, the scheduling entity may add an additional number of zero ('0') bits to the control information to produce a first polynomial. In various aspects of the disclosure, the additional number of '0' bits may be equal to the total number of combined CRC bits. At block 1308, the scheduling entity may divide the first polynomial by a generator polynomial to produce a remainder polynomial that includes the total number of combined CRC bits. At block 1310, the scheduling entity may scramble the combined CRC bits with an identifier associated with the scheduled entity (e.g., a group identifier or a UE-specific identifier) to produce CRC information. Then, at block 1312, the scheduling entity may append the CRC information to the control information in the information block. For example, the CRC generation circuitry 842 shown and described above in connection with FIG. 8 may generate the CRC information.

At block 1314, the scheduling entity may polar encode the information block including the combined CRC bits. For example, the polar encoder circuitry 844 shown and described above in connection with FIG. 8 may polar encode the information block to produce a polar code block containing the control information and combined CRC bits. At block 1316, the scheduling entity may transmit the polar code block over the air interface. For example, the scheduling entity may utilize the transceiver 810 shown in FIG. 8 to transmit the polar code block over the air interface.

Polar Decoding with Combined Crc

Figure 14:
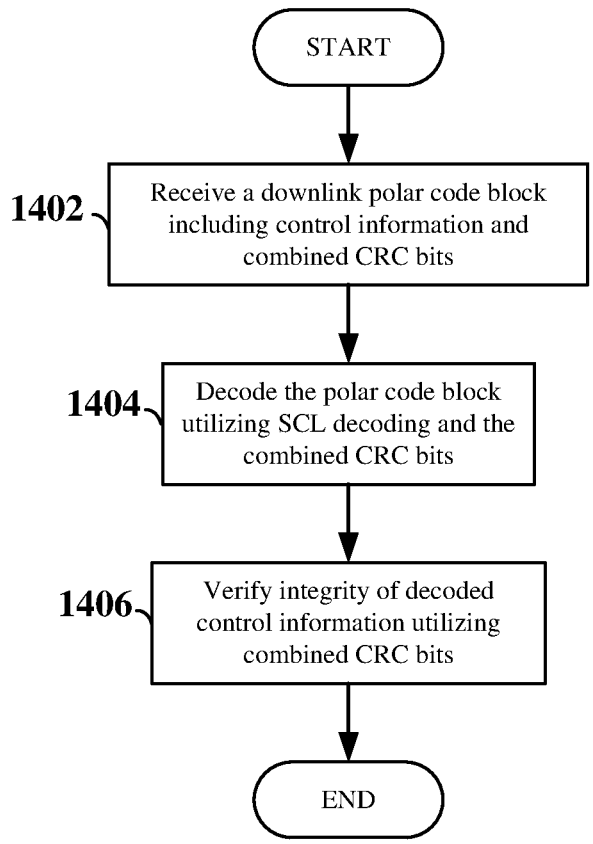
FIG. 14 is a flow chart illustrating an exemplary process for receiving and polar decoding a transmission that includes control information and a combined CRC, in accordance with some aspects of the disclosure.

FIG. 14 is a flow chart illustrating an exemplary process 1400 for receiving and polar decoding a polar code block that includes control information and a combined CRC, in accordance with some aspects of the disclosure. As described below, some or all illustrated features may be omitted in a particular implementation within the scope of the present disclosure, and some illustrated features may not be required for implementation of all embodiments. In some examples, the process 1400 may be carried out by the scheduled entity 900 illustrated in FIG. 9. In some examples, the process 1400 may be carried out by any suitable apparatus or means for carrying out the functions or algorithm described below.

At block 1402, the scheduled entity may receive a polar code block containing control information for the scheduled entity along with combined CRC information. In some examples, the combined CRC information includes a number of CRC bits selected based on a list size utilized in successive-cancellation list (SCL) decoding at the scheduled entity to jointly decode and verify the control information. At block 1404, the scheduled entity may polar decode the polar code block. In some examples, the scheduled entity may utilize SCL decoding and the combined CRC information to decode the polar code block. For example, the polar decoder circuitry 940 shown and described above in connection with FIG. 9 may polar decode the polar code block.

At block 1406, the scheduled entity may check or verify the integrity of the decoded control information. In some examples, the scheduled entity may verify the control information utilizing the combined CRC information. For example, the control information verification circuitry 942 shown and described above in connection with FIG. 9 may verify the integrity of the decoded control information.

Figure 15:
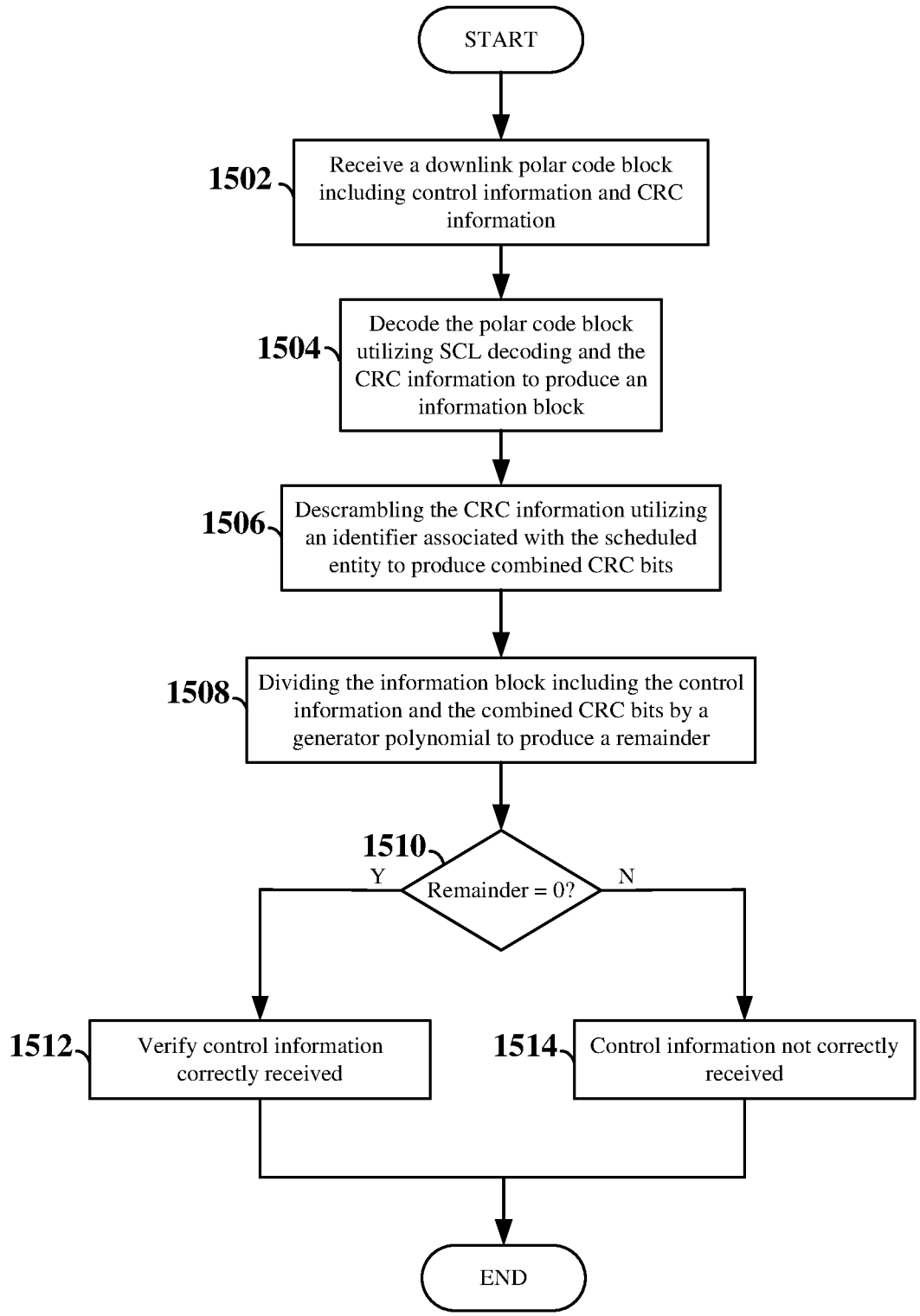
FIG. 15 is a flow chart illustrating another exemplary process for receiving and polar decoding a transmission that includes control information and a combined CRC, in accordance with some aspects of the disclosure.

FIG. 15 is a flow chart illustrating another exemplary process 1500 for receiving and polar decoding a polar code block that includes control information and a combined CRC, in accordance with some aspects of the disclosure. As described below, some or all illustrated features may be omitted in a particular implementation within the scope of the present disclosure, and some illustrated features may not be required for implementation of all embodiments. In some examples, the process 1500 may be carried out by the scheduled entity 900 illustrated in FIG. 9. In some examples, the process 1500 may be carried out by any suitable apparatus or means for carrying out the functions or algorithm described below.

At block 1502, the scheduled entity may receive a polar code block containing control information for the scheduled entity along with combined CRC information. In some examples, the combined CRC information includes a number of combined CRC bits selected based on a list size utilized in successive-cancellation list (SCL) decoding at the scheduled entity to jointly decode and verify the control information. At block 1504, the scheduled entity may polar decode the polar code block. In some examples, the scheduled entity may utilize SCL decoding and the combined CRC information to decode the polar code block. For example, the polar decoder circuitry 940 shown and described above in connection with FIG. 9 may polar decode the polar code block.

At block 1506, the scheduled entity may descramble the CRC information utilizing an identifier associated with the scheduled entity (e.g., a group identifier or a UE-specific identifier) to produce the combined CRC bits. At block 1508, the scheduled entity may divide the information block including the control information and the combined CRC bits by a generator polynomial to produce a remainder (e.g., a remainder polynomial). At block 1510, the scheduled entity may determine whether the remainder is equal to zero (e.g., whether all bits of the remainder polynomial are zero).

If the remainder is equal to zero (Y branch of block 1510), at block 1512, the scheduled entity may verify that the decoded control information was correctly received. However, if the remainder is not equal to zero (N branch of block 1510), at block 1512, the scheduled entity may determine that the decoded control information was not correctly received. For example, the control information verification circuitry 942 shown and described above in connection with FIG. 9 may descramble the CRC information, calculate the remainder, and verify the integrity of the decoded control information based on the remainder value.

Figure 16:
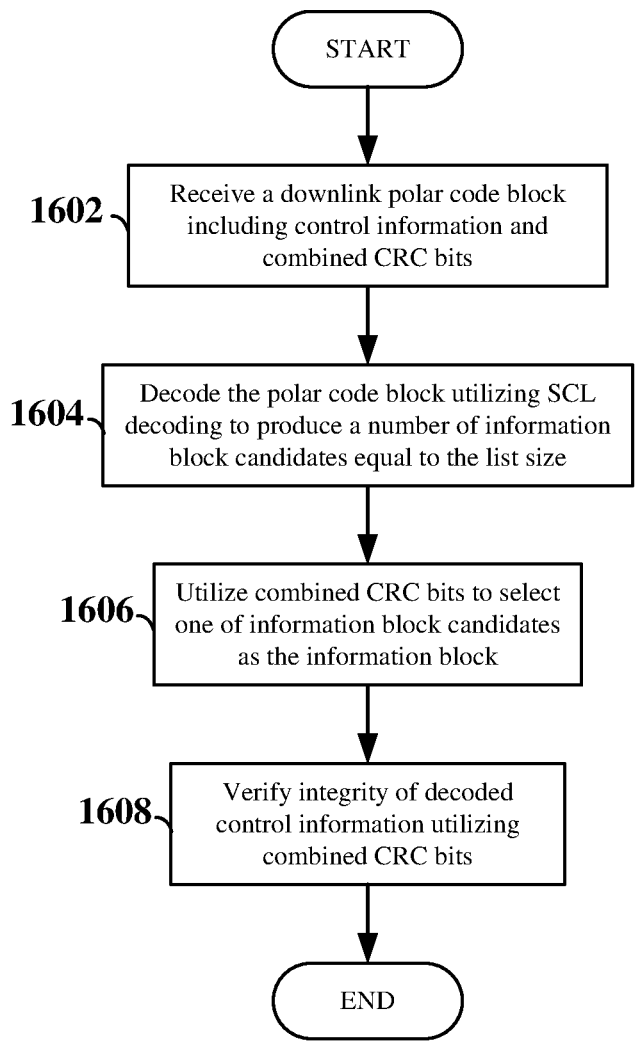
FIG. 16 is a flow chart illustrating another exemplary process for receiving and polar decoding a transmission that includes control information and a combined CRC, in accordance with some aspects of the disclosure.

FIG. 16 is a flow chart illustrating another exemplary process 1600 for receiving and polar decoding a polar code block that includes control information and a combined CRC, in accordance with some aspects of the disclosure. As described below, some or all illustrated features may be omitted in a particular implementation within the scope of the present disclosure, and some illustrated features may not be required for implementation of all embodiments. In some examples, the process 1600 may be carried out by the scheduled entity 900 illustrated in FIG. 9. In some examples, the process 1600 may be carried out by any suitable apparatus or means for carrying out the functions or algorithm described below.

At block 1602, the scheduled entity may receive a polar code block containing control information for the scheduled entity along with combined CRC information. In some examples, the combined CRC information includes a number of CRC bits selected based on a list size utilized in successive-cancellation list (SCL) decoding at the scheduled entity to jointly decode and verify the control information. For example, the transceiver 910 shown and described above in connection with FIG. 9 may receive the polar code block.

At block 1604, the scheduled entity may polar decode the polar code block utilizing SCL decoding to produce a number of information block candidates equal to the list size. At block 1606, the scheduled entity may then utilize the combined CRC bits to select one of the information block candidates as the information block. In some examples, the scheduled entity may use the combined CRC bits to test each of the information block candidates for errors. If more than one information block candidate passes (e.g., produces a remainder of 0), the scheduled entity may select the most probable candidate among those that pass as the information block. For example, the polar decoder circuitry 940 shown and described above in connection with FIG. 9 may polar decode the polar code block.

At block 1608, the scheduled entity may check or verify the integrity of the decoded control information. In some examples, the scheduled entity may verify the control information utilizing the combined CRC information. For example, the control information verification circuitry 942 shown and described above in connection with FIG. 9 may verify the integrity of the decoded control information.

Several aspects of a wireless communication network have been presented with reference to an exemplary implementation. As those skilled in the art will readily appreciate, various aspects described throughout this disclosure may be extended to other telecommunication systems, network architectures and communication standards.

By way of example, various aspects may be implemented within other systems defined by 3GPP, such as Long-Term Evolution (LTE), the Evolved Packet System (EPS), the Universal Mobile Telecommunication System (UMTS), and/or the Global System for Mobile (GSM). Various aspects may also be extended to systems defined by the 3rd Generation Partnership Project 2 (3GPP2), such as CDMA2000 and/or Evolution-Data Optimized (EV-DO). Other examples may be implemented within systems employing IEEE 802.11 (Wi-Fi), IEEE 802.16 (WiMAX), IEEE 802.20, Ultra-Wideband (UWB), Bluetooth, and/or other suitable systems. The actual telecommunication standard, network architecture, and/or communication standard employed will depend on the specific application and the overall design constraints imposed on the system.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in FIGS. 1-16 may be rearranged and/or combined into a single component, step, feature or function or embodied in several components, steps, or functions. Additional elements, components, steps, and/or functions may also be added without departing from novel features disclosed herein. The apparatus, devices, and/or components illustrated in FIGS. 1-9 may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A method of wireless communication, comprising:
generating cyclic redundancy check (CRC) information for an information block, wherein the information block comprises control information, wherein the CRC information comprises at least a total number of combined CRC bits equal to a sum of a first number of integrity check bits and a second number of CRC-aided successive-cancellation list (SCL) bits;
encoding the information block, including the CRC information, utilizing polar coding to generate a polar code block; and
providing the polar code block over a wireless air interface.

2. The method of claim 1, further comprising:
selecting the second number of the CRC-aided SCL bits is selected based on a list size associated with successive cancellation list (SCL) decoding.

3. The method of claim 2, further comprising:
selecting the second number of the CRC-aided SCL bits to be equal to a binary logarithm of the list size.

4. The method of claim 3, wherein:
the second number of the CRC-aided SCL bits comprises three bits when the list size is equal to eight; and
the second number of the CRC-aided SCL bits comprises five bits when the list size is equal to thirty-two.

5. The method of claim 4, wherein the first number of the integrity check bits comprises sixteen bits.

6. The method of claim 1, wherein the information block comprises a plurality of original bit locations and the polar code block comprises a plurality of coded bit locations, wherein each of the plurality of coded bit locations corresponds to one of a plurality of sub-channels, and wherein generating the information block further comprises:
determining a reliability metric for each of the original bit locations to produce a plurality of reliability metrics;
sorting the plurality of sub-channels based on the plurality of reliability metrics in order from highest reliability metrics to lowest reliability metrics; and
allocating a portion of the plurality of sub-channels either comprising the highest reliability metrics or distributed among the plurality of sub-channels to the CRC information.

7. The method of claim 1, wherein generating the CRC information further comprises:
adding an additional number of zero bits to the control information to produce a first polynomial, wherein the additional number of the zero bits is equal to the total number of the combined CRC bits;
dividing the first polynomial by a generator polynomial to produce a remainder polynomial comprising the total number of the combined CRC bits;
scrambling the combined CRC bits with an identifier associated with a scheduled entity to receive the polar code block to produce the CRC information; and
appending the CRC information to the control information in the information block.

8. An apparatus configured for polar coding, the apparatus comprising:
one or more processors; and
one or more memories coupled to the one or more processors,
wherein the one or more processors are configured to:
generate cyclic redundancy check (CRC) information for an information block, wherein the information block comprises control information, wherein the CRC information comprises at least a total number of combined CRC bits equal to a sum of a first number of integrity check bits and a second number of CRC-aided successive-cancellation list (SCL) bits;
encode the information block, including the CRC information, utilizing polar coding to generate a polar code block; and
provide the polar code block over a wireless air interface.

9. The apparatus of claim 8, wherein the one or more processors are further configured to:
select the second number of the CRC-aided SCL bits based on a list size associated with successive cancellation list (SCL) decoding.

10. The apparatus of claim 9, wherein the one or more processors are further configured to:
select the second number of the CRC-aided SCL bits to be equal to a binary logarithm of the list size.

11. The apparatus of claim 10, wherein:
the second number of the CRC-aided SCL bits comprises three bits when the list size is equal to eight; and
the second number of the CRC-aided SCL bits comprises five bits when the list size is equal to thirty-two.

12. The apparatus of claim 11, wherein the first number of the integrity check bits comprises sixteen bits.

13. The apparatus of claim 8, wherein the information block comprises a plurality of original bit locations and the polar code block comprises a plurality of coded bit locations, wherein each of the plurality of coded bit locations corresponds to one of a plurality of sub-channels, and wherein the one or more processors are further configured to:
determine a reliability metric for each of the original bit locations to produce a plurality of reliability metrics;
sort the plurality of sub-channels based on the plurality of reliability metrics in order from highest reliability metrics to lowest reliability metrics; and
allocate a portion of the plurality of sub-channels either comprising the highest reliability metrics or distributed among the plurality of sub-channels to the CRC information.

14. The apparatus of claim 8, wherein the one or more processors are further configured to:
add an additional number of zero bits to the control information to produce a first polynomial, wherein the additional number of the zero bits is equal to the number of the combined CRC bits;
divide the first polynomial by a generator polynomial to produce a remainder polynomial comprising the number of the combined CRC bits;
scramble the combined CRC bits with an identifier associated with a scheduled entity to receive the polar code block to produce the CRC information; and
append the CRC information to the control information in the information block.

15. A method of wireless communication operable at a user equipment (UE), comprising:
- receiving a polar code block comprising control information for the UE and cyclic redundancy check (CRC) information comprising at least a total number of combined CRC bits equal to a sum of a first number of integrity check bits and a second number of CRC-aided successive-cancellation list (SCL) bits;
- decoding the polar code block utilizing SCL decoding and the CRC information to produce an information block comprising the control information and the CRC information; and
- verifying an integrity of the control information utilizing the CRC information.

16. The method of claim 15, wherein the second number of CRC-aided SCL bits is selected based on a list size utilized in the SCL decoding.

17. The method of claim 16, wherein the second number of CRC-aided SCL bits is equal to a binary logarithm of the list size.

18. The method of claim 17, wherein:
- the second number of the CRC-aided SCL bits comprises three bits when the list size is equal to eight; and
- the second number of the CRC-aided SCL bits comprises five bits when the list size is equal to thirty-two.

19. The method of claim 18, wherein the first number of the integrity check bits comprises sixteen bits.

20. The method of claim 15, wherein the information block comprises a plurality of original bit locations and the polar code block comprises a plurality of coded bit locations, wherein each of the coded bit locations corresponds to one of a plurality of sub-channels, and wherein receiving the polar code block further comprises:
- receiving the CRC information within a portion of the plurality of sub-channels either comprising highest reliability metrics or distributed among the plurality of sub-channels.

21. The method of claim 15, wherein verifying the integrity of the control information utilizing the CRC information further comprises:
- descrambling the CRC information utilizing an identifier associated with the UE to produce the combined CRC bits;
- dividing the information block comprising the control information and the combined CRC bits by a generator polynomial to produce a remainder; and
- if the remainder is equal to zero, verifying the control information is correctly received.

22. The method of claim 15, wherein decoding the polar code block utilizing SCL decoding and the CRC information further comprises:
- decoding the polar code block to produce a plurality of information block candidates, wherein a number of the plurality of information block candidates is equal to a list size utilized in the SCL decoding; and
- utilizing the CRC information to select one of the plurality of information block candidates as the information block.

23. An apparatus configured for polar decoding, the apparatus comprising:
- one or more processors; and
- one or more memories coupled to the one or more processors,
- wherein the one or more processors are configured to:
  - receive a polar code block comprising control information and cyclic redundancy check (CRC) information comprising at least a total number of combined CRC bits equal to a sum of a first number of integrity check bits and a second number of CRC-aided successive-cancellation list (SCL) bits;
  - decode the polar code block utilizing SCL decoding and the CRC information to produce an information block comprising the control information and the CRC information; and
  - verify an integrity of the control information utilizing the CRC information.

24. The apparatus of claim 23, wherein the second number of CRC-aided SCL bits is selected based on a list size utilized in the SCL decoding.

25. The apparatus of claim 24, wherein the second number of CRC-aided SCL bits is equal to a binary logarithm of the list size.

26. The apparatus of claim 25, wherein:
- the second number of the CRC-aided SCL bits comprises three bits when the list size is equal to eight; and
- the second number of the CRC-aided SCL bits comprises five bits when the list size is equal to thirty-two.

27. The apparatus of claim 26, wherein the first number of the integrity check bits comprises sixteen bits.

28. The apparatus of claim 23, wherein the information block comprises a plurality of original bit locations and the polar code block comprises a plurality of coded bit locations, wherein each of the coded bit locations corresponds to one of a plurality of sub-channels, and wherein the one or more processors are further configured to:
- receive the CRC information within a portion of the plurality of sub-channels either comprising highest reliability metrics or distributed among the plurality of sub-channels.

29. The apparatus of claim 23, wherein the one or more processors are further configured to:
- descramble the CRC information utilizing an identifier associated with the apparatus to produce the combined CRC bits;
- divide the information block comprising the control information and the combined CRC bits by a generator polynomial to produce a remainder; and
- if the remainder is equal to zero, verify the control information is correctly received.

30. The apparatus of claim 23, wherein the one or more processors are further configured to:
- decode the polar code block to produce a plurality of information block candidates, wherein a number of the plurality of information block candidates is equal to a list size utilized in the SCL decoding; and
- utilize the CRC information to select one of the plurality of information block candidates as the information block.

* * * * *